United States Patent
Miyoshi et al.

(10) Patent No.: US 11,910,637 B2
(45) Date of Patent: Feb. 20, 2024

(54) ORGANIC EL PANEL

(71) Applicant: KANEKA CORPORATION, Osaka (JP)

(72) Inventors: Takayuki Miyoshi, Otsu (JP); Katsuya Ouchi, Kamikita-gun (JP)

(73) Assignee: KANEKA CORPORATION, Osaka (JP)

(*) Notice: Subject to any disclaimer, the term of this patent is extended or adjusted under 35 U.S.C. 154(b) by 390 days.

(21) Appl. No.: 17/435,776

(22) PCT Filed: Jan. 31, 2020

(86) PCT No.: PCT/JP2020/003767
§ 371 (c)(1),
(2) Date: Sep. 2, 2021

(87) PCT Pub. No.: WO2020/195160
PCT Pub. Date: Oct. 1, 2020

(65) Prior Publication Data
US 2022/0158116 A1    May 19, 2022

(30) Foreign Application Priority Data
Mar. 25, 2019 (JP) .................................. 2019-057178

(51) Int. Cl.
*H01L 51/50* (2006.01)
*H10K 50/84* (2023.01)
(Continued)

(52) U.S. Cl.
CPC ........... *H10K 50/841* (2023.02); *H10K 50/87* (2023.02); *H10K 59/131* (2023.02)

(58) Field of Classification Search
CPC ........................... H10K 50/841; H10K 59/131
See application file for complete search history.

(56) References Cited

U.S. PATENT DOCUMENTS

| | | |
|---|---|---|
| 2009/0302729 A1 | 12/2009 | Amelung et al. |
| 2015/0008412 A1 | 1/2015 | Chery et al. |
| 2018/0151820 A1 | 5/2018 | Saiki |

FOREIGN PATENT DOCUMENTS

| | | |
|---|---|---|
| EP | 2271178 A1 | 1/2011 |
| EP | 2566298 A1 | 3/2013 |

(Continued)

OTHER PUBLICATIONS

International Bureau of WIPO, Written Opinion Issued in Application No. PCT/JP2020/003767, dated Mar. 31, 2020, WIPO, 4 pages.
(Continued)

*Primary Examiner* — Anthony Ho
(74) *Attorney, Agent, or Firm* — Alleman Hall & Tuttle LLP

(57) ABSTRACT

Provided is an organic EL panel. A first conductive film, an organic functional film, a second conductive film, and a sealing film are provided on a substrate. The first conductive film includes a first main body, a first electrode pad, and a second electrode pad. The second conductive film includes a second main body, and a second electrode pad region extending from the second main body toward the first vertex. The second electrode pad region extends to a stretched region exposed from the sealing film which covers a light-emitting region. A first electrode conduction path surrounds at least half of the light-emitting region and connects the electrode pads. A circuit board is fixed near the first vertex. A first electrode wire is configured to adhere to the electrode pads. A second electrode wire is configured to adhere to the second electrode pad region in the stretched region.

10 Claims, 15 Drawing Sheets

(51) Int. Cl.
*H10K 50/87* (2023.01)
*H10K 59/131* (2023.01)

(56) References Cited

FOREIGN PATENT DOCUMENTS

| | | |
|---|---|---|
| JP | 2011096374 A | 5/2011 |
| JP | 2014164997 A | 9/2014 |
| JP | 2014191922 A | 10/2014 |
| JP | 2015503821 A | 2/2015 |
| WO | 2017033630 A1 | 3/2017 |

OTHER PUBLICATIONS

European Patent Office, Supplementary European Search Report Issued in U.S. Appl. No. 20/778,421, dated Feb. 10, 2022, Netherlands, 2 pages.

BOTTOM VIEW

PLAN VIEW

A-A CROSS-SECTIONAL VIEW

B-B CROSS-SECTIONAL VIEW

C-C CROSS-SECTIONAL VIEW

ORGANIC EL PANEL

TECHNICAL FIELD

The present invention relates to an organic EL panel in which power is supplied from one vertex through a circuit board. In particular, the present invention relates to a rectangular organic EL panel in which power supply through a circuit board is made from one vertex of the rectangular panel.

BACKGROUND ART

An organic EL element is a planar-light-emitting element that utilizes a phenomenon in which light is emitted when an electric field is applied to a substance. An organic EL panel is a component having organic EL elements provided on a substrate, and such an organic EL panel has been applied to a planar light source, a display, and the like by making use of its characteristics such as a self-luminous property and thin profile.

For example, Patent Document 1 discloses an organic EL panel including a substrate 10, a first electrode layer 12A and a second electrode layer 12K provided on the substrate 10, an organic EL layer 14 provided on the first electrode layer 12A, a third electrode layer 16K provided on the organic EL layer 14 and connected to the second electrode layer 12K, a sealing layer 18 provided on the third electrode layer 16K, a first electrode layer 22A provided on the sealing layer 18, an insulating layer 24 provided on the first electrode layer 22A, and a second electrode layer 26K provided on the insulating layer 24.

The organic EL panel disclosed in Patent Document 1 eliminates the need for a wiring member and thus has a simplified structure and allows an increase in production efficiency by automation while ensuring a heat equalizing effect.

In order to cause the organic EL element to emit light with high luminance, it is necessary to apply a large current. However, the organic EL element typically has an anode made of a transparent conductive metal oxide (for example, indium tin oxide (ITO)), and such an anode is higher in sheet resistance than a cathode made of a metal film, an alloy film, or the like. As a result, the organic EL element has a potential difference larger on the anode side, which makes in-plane variations in luminance larger. Therefore, a solution to the problem has been studied.

For example, Patent Document 2 discloses an organic EL element including a transparent anode of sheet resistance R1, a cathode of sheet resistance R2, an anode contact, an active zone, a cathode contact having a contact surface and disposed on the active zone, and a reflector covering the active zone above an OLED system Et. In such an organic EL element, when a distance between one end of the anode contact and a point of the contact surface closest to the one end is defined as D, and a distance between the one end and the other end that is an end of an anode region opposite to the point of the contact surface is defined as L, a ratio D/L falls within a predetermined range depending on a value of an ratio R2/R1.

PRIOR ART DOCUMENTS

Patent Documents

Patent Document 1: JP 2011-96374 A
Patent Document 2: JP 2015-503821 A

DISCLOSURE OF INVENTION

Technical Problem

In the technical solution disclosed in Patent Document 1, it is necessary to form two conductive layers and an insulating layer on the organic EL element although it is not needed to use a wiring member, which increases the number of man-hours required to form the organic EL element. Further, in the technical solution disclosed in Patent Document 1, it is necessary to form materials of the conductive layer and the insulating layer all over the light-emitting region. Therefore, the organic EL element disclosed in Patent Document 1 consumes a large amount of material and may become expensive.

Patent Document 2 substantially discloses a means for suppressing unevenness in luminance caused by an electrode having a larger resistance by using a wiring provided on a periphery of the light-emitting region. However, in the technical solution disclosed in Patent Document 2, a positional relationship between a sealing structure and the wiring is not defined, and thus reliability of the organic EL panel may be reduced due to permeation of moisture. Further, in the technical solution disclosed in Patent Document 2, an isolated portion of a power supply terminal is not defined, and therefore unevenness in luminance may occur due to current concentration at a vertex portion of the light-emitting region.

It is therefore an object of the present invention to provide an organic EL panel that is low in cost, high in sealing performance, and high in reliability compared to the related art.

Solution to Problem

The present inventors have studied a method in which power for a rectangular organic EL panel is supplied at only one vertex of the rectangle from the outside through a circuit board. As a result, the present inventors have found that the following configurations (1) to (3) can produce a synergy effect and solve the above-described problems, thus being led to the development of the present invention.

(1) Using a right-angled L-shaped circuit board and from the outside applying a negative potential to a position corresponding to one vertex and a positive potential to two positions which correspond to ends of the right-angled L-shape where the one vertex are located between the ends.

(2) Sealing an organic EL element corresponding to a light-emitting region other than a region corresponding to the one vertex with a sealing film.

(3) Enclosing a first electrode layer of the organic EL element corresponding to the light-emitting region with a positive potential conduction path provided on the outside of the first electrode layer.

According to an aspect of the present invention as a result of intensive studies based on the above-described considerations, provided is an organic EL panel including a light-emitting surface and a back surface as opposite main surfaces, the organic EL panel including a first side and a second side adjacent to each other with a first vertex interposed therebetween when viewed in plan, the organic EL panel including a light-emitting region in a center of the light-emitting surface, the organic EL panel including: a first conductive film; an organic functional film; a second conductive film; and a sealing film, each of the films being patterned and provided on a substrate in this order toward the back surface of the organic EL panel; the organic EL panel further including at least a first electrode region and a second electrode stretched region when viewed in plan, wherein the first conductive film, when viewed in plan, includes in the first electrode region: a first main body overlapping with the light-emitting region; a first electrode pad protruding from the first main body toward the first side; and a second electrode pad protruding from the first main body toward the second side, the first and the second electrode pads being connected continuously through the first main body, wherein the second conductive film, when viewed in plan, includes: a second main body overlapping with the light-emitting region; and a second electrode pad region protruding from the second main body toward the first vertex to reach the second electrode stretched region, wherein the sealing film does not overlap with the second electrode stretched region whereas the sealing film overlaps completely with the light-emitting region when viewed in plan, the sealing film further covering other part of the organic functional film connected continuously to the organic functional film overlapping with the light-emitting region; and wherein the organic EL panel includes a first electrode conduction path and a circuit board, the first electrode conduction path extending, when viewed in plan, to surround at least one half of a periphery of the light-emitting region, so that the first electrode conduction path connects the first electrode pad and the second electrode pad, the circuit board that is fixed near the first vertex including a first electrode wire and a second electrode wire, the first electrode wire being configured to adhere, in a conductive manner, to the first electrode pad and the second electrode pad, the second electrode wire being configured to adhere directly or indirectly, in a conductive manner, to the second electrode pad region in the second electrode stretched region.

Herein, "near" means a sufficiently close position based on a whole view of the organic EL panel, and specifically, the shortest distance is equal to or less than 3% of the length of one side of the organic EL panel. That is, "near the first vertex" means that the shortest distance to the first vertex is equal to or less than 3% of the length of one side of the organic EL panel and is preferably equal to or less than 1%. The same applies to the following.

Herein "configured to adhere indirectly in a conductive manner" means that conductors are configured to adhere to each other with another conductor interposed in between to electrically connect to each other. That is, "the second electrode wire is configured to adhere indirectly, in a conductive manner, to the second electrode pad region in the second electrode stretched region" means that the second electrode wire and the second electrode pad region are configured to adhere to each other via another conductor interposed between the second electrode wire and the second electrode pad region.

According to this aspect, the power supply through the circuit board can be made substantially only from a portion near one vertex, so that the circuit board can be made small compared to the related art, and the cost can be reduced accordingly.

According to this aspect, the sealing film covers not only the first conductive film, the organic functional film, and the second conductive film in the light-emitting region, but also the other part of the organic functional film connected to the organic functional film in the light-emitting region, so that it is possible to sufficiently prevent permeation of moisture into each layer belonging to the light-emitting region, and higher long-term reliability can be ensured accordingly.

According to this aspect, the first electrode pad and the second electrode pad are connected by the first electrode conduction path, so that power can be supplied to the first main body at the same time. This allows a current to pass through the organic functional film in the light-emitting region in two directions centering on the first main body, thereby suppressing unevenness in luminance or making unevenness in luminance less conspicuous.

When an area of the light-emitting region per unit area is increased to narrow a frame, the structure of the circuit board in the related art tends to increase an area where the circuit board and the substrate adhere to each other by an adhesive means such as an adhesive. This makes an allowable range of elastic deformation of the adhesive means small, and when stress is generated in the adhesive means due to a difference in coefficient of linear expansion between the circuit board (for example, FPC) and the substrate (for example, glass substrate) when lighted to cause elastic deformation, the circuit board may warp or the adhesive means such as an adhesive may separate, leading to a decrease in adhesive strength of the circuit board.

On the other hand, according to this aspect, the area of the circuit board can be made small, so that the allowable range of elastic deformation of the adhesive means can be made larger accordingly. Therefore, even when the circuit board and the substrate are different in coefficient of linear expansion from each other, and stress is generated in the adhesive means, warpage or separation can be prevented. This in turn makes it possible to suppress a decrease in adhesive strength due to the narrowing of the frame.

According to a preferable aspect, the organic EL panel includes a third side adjacent to the first side with a second vertex interposed therebetween when viewed in plan, the organic EL panel further including a first isolated region and a second isolated region, both isolated from the first electrode region, the first isolated region including a first isolated portion extending from the first vertex to the first electrode pad along the first side and a second isolated portion extending from the first vertex to the second electrode pad along the second side, the second isolated region including a third isolated portion extending from the second vertex to the first electrode pad along the first side, the first isolated portion being longer than the third isolated portion.

According to this aspect, the first isolated portion and the third isolated portion extending along the same first side are different in length from each other, and the first isolated portion is longer than the third isolated portion. That is, the first electrode pad is located further away from the first vertex, so that luminance near the first vertex that tends to be high can be made low, and unevenness in luminance can be reduced accordingly.

According to a more preferable aspect, the first isolated portion is equal in length to the second isolated portion.

According to this aspect, a distance from the first vertex to the first electrode pad is equal to a distance from the first vertex to the second electrode pad, so that a current can be evenly passed from the first vertex to the first electrode pad and the second electrode pad, and unevenness in luminance can be further reduced accordingly.

According to a more preferable aspect, the first isolated portion is equal in width to the second isolated portion.

According to a preferable aspect, the organic EL panel further includes a first isolated region isolated from the first electrode region, wherein the first conductive film formed of metal oxide includes an island portion electrically separated from the first electrode region in the first isolated region, wherein the second electrode stretched region belongs to part of the first isolated region, wherein the island portion is configured to adhere to the second electrode pad region in the second electrode stretched region, and wherein the second electrode wire is configured to adhere, in a conductive manner, to the second electrode pad region or the island portion in the second electrode stretched region.

According to this aspect, the island portion can be used as a base of the second electrode pad region and/or a base of the second electrode wire, the adhesion of the first electrode conduction path onto the substrate can be made via the first conductive film in the same manner as the adhesion to the first electrode pad or the second electrode pad. This allows the adhesive strength to be kept constant, leading to an increase in reliability.

According to a preferable aspect, the organic EL panel further includes a heat equalizing sheet provided on a back surface side of the sealing film, wherein the heat equalizing sheet is a graphite sheet and overlaps completely with the light-emitting region when viewed in plan.

According to this aspect, unevenness in temperature in the light-emitting region can be suppressed, and unevenness in luminance can be further reduced accordingly.

According to a preferable aspect, the first electrode pad is located at a biased position from a midpoint of the first side towards opposite to the first vertex in an extending direction of the first side, and the second electrode pad is located at a biased position from a midpoint of the second side towards opposite to the first vertex in an extending direction of the second side.

According to this aspect, the luminance near the first vertex can be made low, and in-plane unevenness in luminance can be reduced accordingly.

According to a more preferable aspect, the organic EL panel has a rectangular shape or a square shape with the first side, the second side, a third side, and a fourth side serving as each side when viewed in plan, the organic EL panel further including: a third electrode pad protruding from the first main body toward the third side; and a fourth electrode pad protruding from the first main body toward the fourth side, wherein the first electrode pad, the second electrode pad, the third electrode pad, and the fourth electrode pad are connected continuously through the first main body, the third electrode pad being located near a midpoint of the third side in an extending direction of the third side, the fourth electrode pad being located near a midpoint of the fourth side in an extending direction of the fourth side.

According to a preferable aspect, the organic EL panel has a rectangular shape or a square shape when viewed in plan, the organic EL panel further including a first isolated region and a second isolated region isolated from the first electrode region, wherein the first isolated region includes a first isolated portion extending from the first vertex to the first electrode pad along the first side and a second isolated portion extending from the first vertex to the second electrode pad along the second side, wherein potential distribution in the first main body has: when lighted, two local maximum points; and a local minimum point located between the two local maximum points on a diagonal line passing through the first vertex when viewed in plan, and wherein the local minimum point is located at a position opposite to the first vertex from the center of the first main body portion on the diagonal line.

According to this aspect, the luminance near the first vertex can be made low, and in-plane unevenness in luminance can be reduced accordingly.

According to an aspect of the present invention, provided is an organic EL panel including a light-emitting surface and a back surface as opposite main surfaces, the organic EL panel with a shape of a quadrangle including a first, second, third, and fourth sides when viewed in plan, the adjacent first and second sides interposing a first vertex therebetween, the organic EL panel including a light-emitting region in a center of the light-emitting surface, the organic EL panel including: a first conductive film; an organic functional film; a second conductive film; and a sealing film, each of the films being patterned and provided on a substrate in this order toward the back surface of the organic EL panel; the organic EL panel further including at least a first electrode region and a second electrode stretched region when viewed in plan, wherein the first conductive film includes in the first electrode region: a first main body overlapping with the light-emitting region; a first electrode pad protruding from the first main body toward the first side; a second electrode pad protruding from the first main body toward the second side; a third electrode pad protruding from the first main body toward the third side; and a fourth electrode pad protruding from the first main body toward the fourth side, the first, the second, the third, and the fourth electrode pads being connected continuously through the first main body, wherein the second conductive film, when viewed in plan, includes: a second main body overlapping with the light-emitting region; and a second electrode pad region protruding from the second main body toward the first vertex to reach the second electrode stretched region, wherein the sealing film does not overlap with the second electrode stretched region whereas the sealing film overlaps completely with the light-emitting region when viewed in plan, the sealing film further covering the second electrode pad region and other part of the organic functional film connected continuously to the organic functional film overlapping with the light-emitting region, and wherein the organic EL panel includes a first electrode conduction path and a circuit board, the first electrode conduction path extending, when viewed in plan, to surround at least one half of a periphery of the light-emitting region, so that the first electrode conduction path connects the first, the second, the third, and the fourth electrode pads, the circuit board that is fixed near the first vertex including a first electrode wire and a second electrode wire, the first electrode wire being configured to adhere, in a conductive manner, to the first electrode pad and the second electrode pad, the second electrode wire being configured to adhere directly or indirectly, in a conductive manner, to the second electrode pad region in the second electrode stretched region.

According to this aspect, it is possible to make the light-emitting region low cost and low unevenness in luminance compared to the related art, and to make reliability higher.

Further, according to this aspect, even when the light-emitting region is enlarged to narrow the frame, a decrease in adhesive strength of the circuit board can be suppressed.

Effect of Invention

According to the present invention, an organic EL panel that is low in cost, high in sealing performance, and high in reliability compared to the related art can be provided.

BRIEF DESCRIPTION OF DRAWINGS

FIGS. 12A and 12B are a diagram for describing an organic EL panel according to an embodiment different from FIG. 1 according to the present invention, wherein FIG. 12A shows a bottom view, and FIG. 12B shows a plan view.

FIGS. 13A, 13B, and 13C are a cross-sectional view of the organic EL panel shown in FIGS. 12A and 12B, wherein FIG. 13A is a cross-sectional view taken along A-A of FIG. 12B, FIG. 13B is a cross-sectional view taken along B-B of FIG. 12B, and FIG. 13C being a cross-sectional view taken along C-C of FIG. 12B.

BEST MODE FOR CARRYING OUT THE INVENTION

A description below explains a process of producing a rectangular organic EL panel 100 according to an embodiment of the present invention with reference to FIGS. 1 to 7, and also explains preferred embodiments, components, and the like according to the present invention.

Note that each drawing is a schematic drawing, and plane dimensions, thickness, a thickness ratio between layers, and the like are different from the actual ones. Note that FIGS. 1 to 7 show the rectangular organic EL panel 100 as viewed from a back surface 102 (non-light-emitting surface) side.

Further, FIGS. 1 to 7 illustrate an embodiment in which a length x of a line segment of an L-shaped isolated portion 71 is equal to a length y of a line segment of a remaining L-shaped isolated portion 72, and FIGS. 12A and 12B to 19 illustrate an embodiment in which the length x of the line segment the L-shaped isolated portion 71 is longer than the length y of the line segment of the remaining L-shaped isolated portion 72. It goes without saying that the present invention is applicable to not only such illustrated embodiments but also other embodiments as long as the embodiments fall within the technical scope.

(Rectangular Organic EL Panel 100)

Figure 12A:
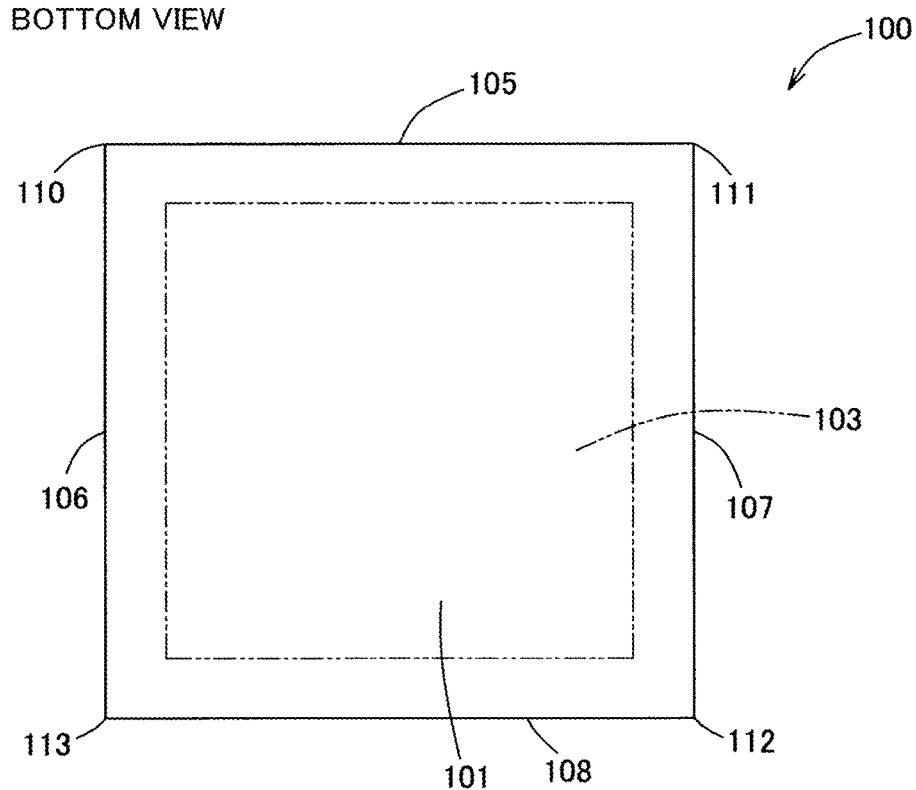
Figure 12B:
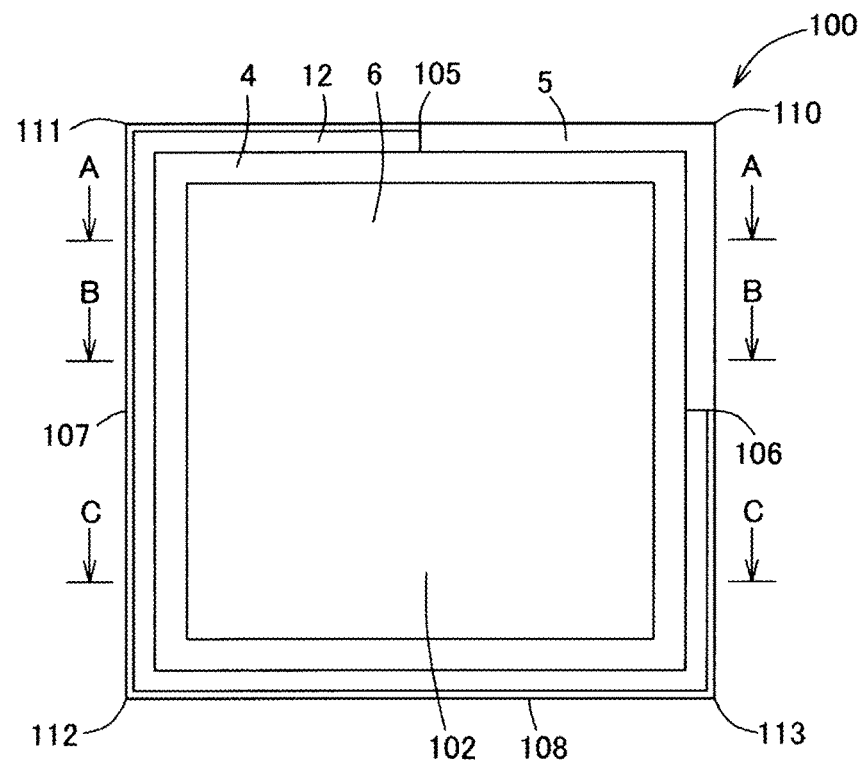

As shown in FIGS. 12A and 12B, the rectangular organic EL panel 100 is a rectangular and plate-shaped member having a light-emitting surface 101 and a back surface 102 as opposite main surfaces.

The rectangular organic EL panel 100 includes a light-emitting region 103 that emits light in a lighting state where power is kept supplied from the outside. The light-emitting region 103 is located in a center of the light-emitting surface 101 when viewed in plan and has a rectangular shape like a contour of the rectangular organic EL panel 100.

Herein, "rectangular" means a quadrilateral with right-angled corners each serving as a vertex and includes not only a rectangle but also a square. That is, the rectangular organic EL panel 100 has a square shape or a rectangular shape.

In the following description, the rectangular organic EL panel 100 is also simply referred to as an organic EL panel 100.

As shown in FIGS. 12A and 12B, the organic EL panel 100 has a first side 105, a second side 106, a third side 107, and a fourth side 108 when viewed in plan, and the sides 105 to 108 form a first vertex 110, a second vertex 111, a third vertex 112, and a fourth vertex 113 at four corners.

Figure 18:
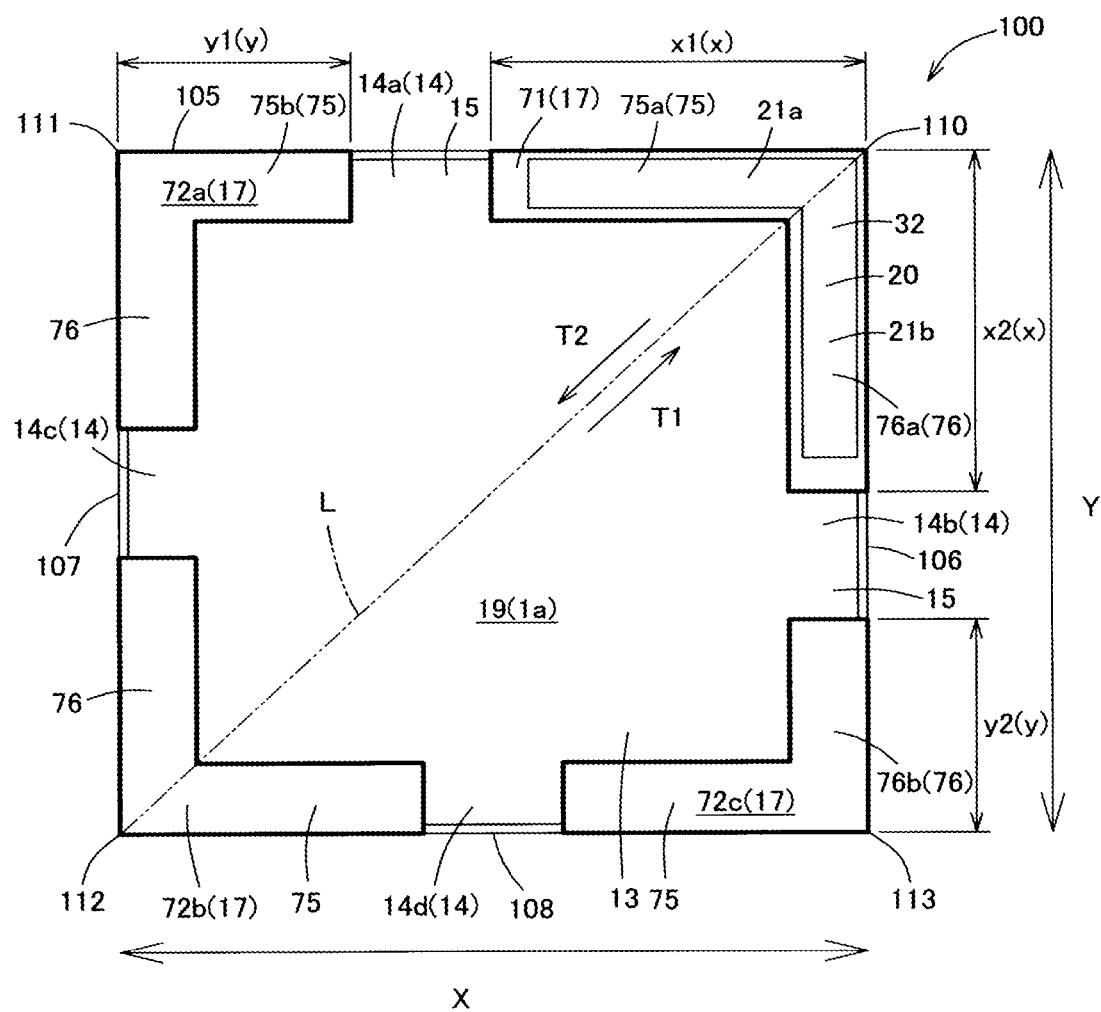
FIG. 18 is a diagram for describing each region of the organic EL panel shown in FIGS. 12A and 12B, showing only the translucent insulation substrate 10 and the first conductive film 1.

As shown in FIG. 18, the horizontal sides 105, 108 extend in a horizontal direction X, and the vertical sides 106, 107 extend in a vertical direction Y.

The first side 105 is adjacent to the second side 106 with the first vertex 110 interposed between the first side 105 and the second side 106 and adjacent to the third side 107 with the second vertex 111 interposed between the first side 105 and the third side 107. The second side 106 is adjacent to the fourth side 108 with the fourth vertex 113 interposed between the second side 106 and the fourth side 108, and the third side 107 is adjacent to the fourth side 108 with the third vertex 112 interposed between the third side 107 and the fourth side 108.

When the organic EL panel 100 has a square shape as shown in FIG. 18, it is preferable that the organic EL panel 100 is line-symmetrical about a diagonal line L, serving as an axis of symmetry, passing through the first vertex 110 and the third vertex 112 when viewed in plan.

Figure 13A:
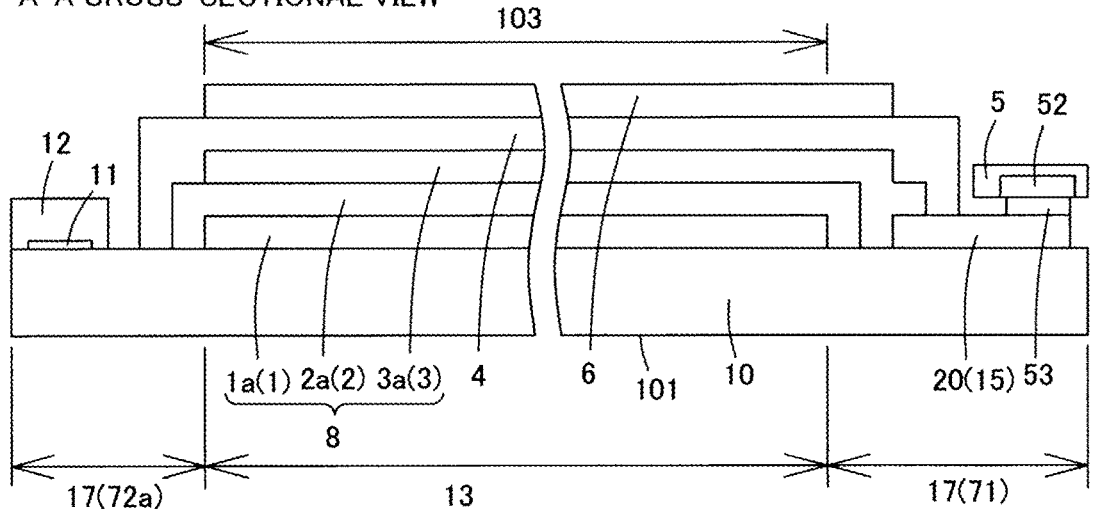
Figure 13B:
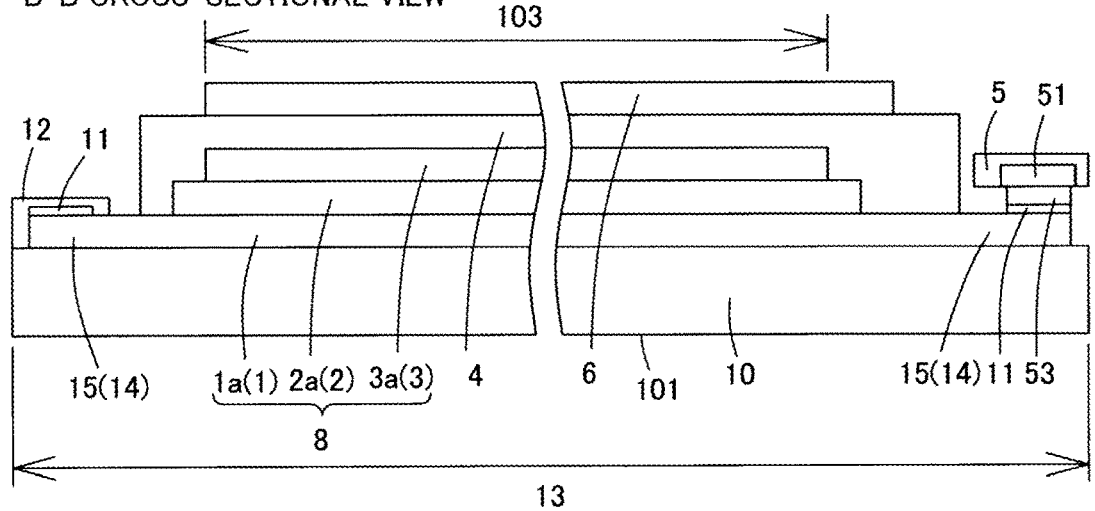
Figure 13C:
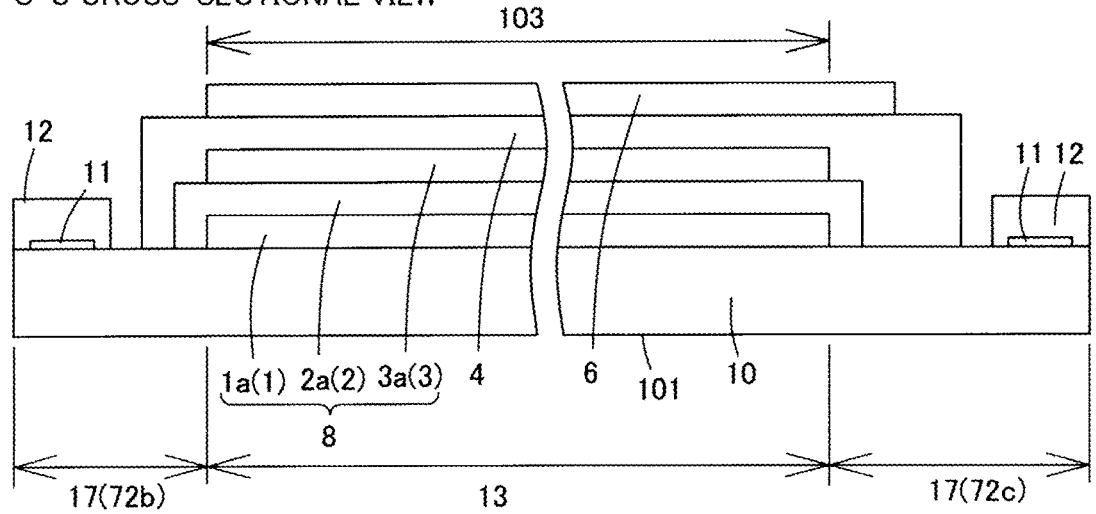

As shown in FIGS. 13A, 13B, and 13C, the organic EL panel 100 includes a multilayer substrate including a first conductive film 1, a functional film 2, a second conductive film 3, and a sealing film 4 stacked on a translucent insulation substrate 10 in this order toward the back surface 102. The first conductive film 1, the functional film 2, the second conductive film 3, and the sealing film 4 are each a patterned thin film.

Figure 17:
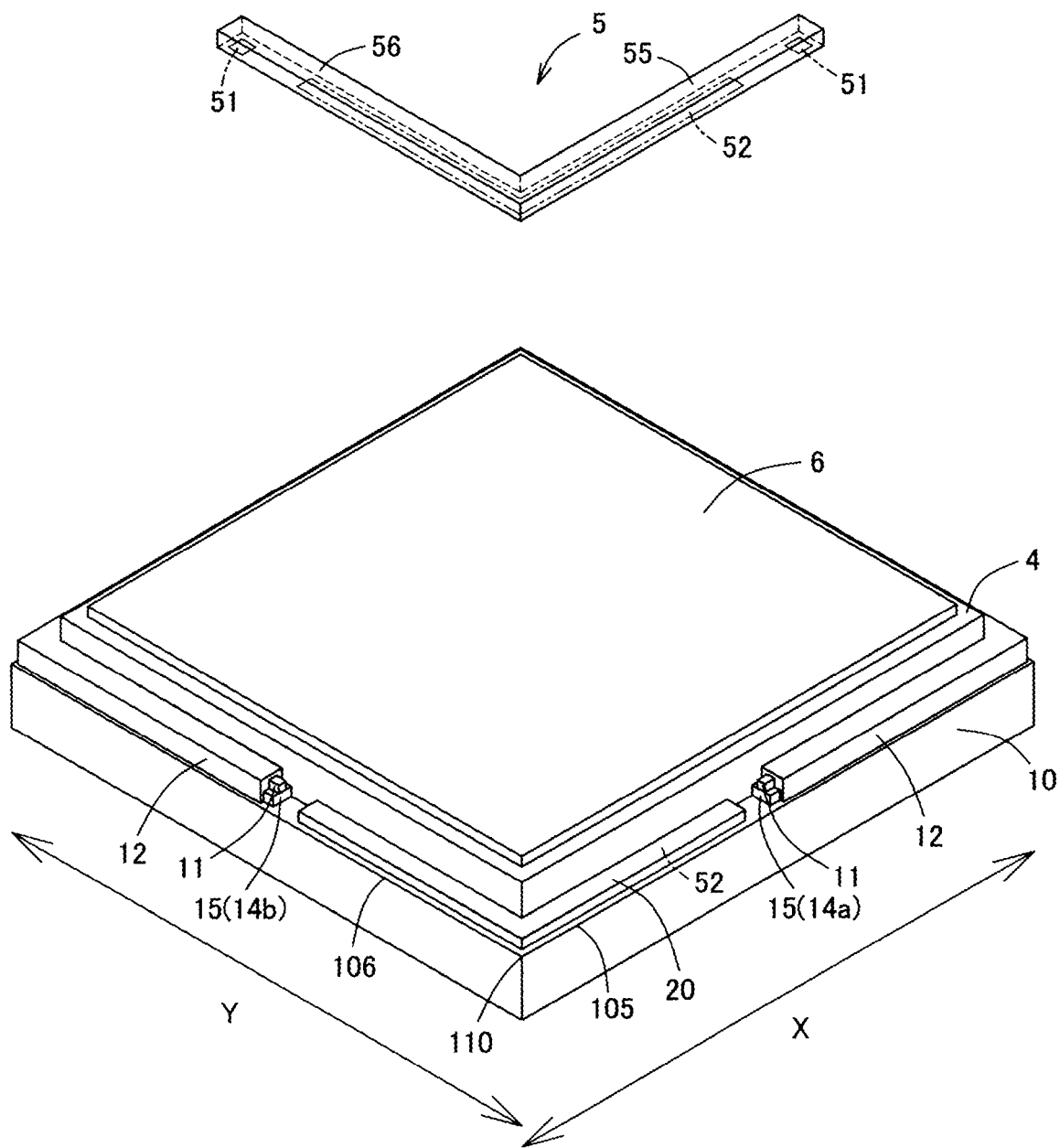
FIG. 17 is an exploded perspective view, as viewed from the back surface side after the single circuit board 5 is removed from the organic EL panel shown in FIGS. 12A and 12B.

As shown in FIG. 17, the organic EL panel 100 includes a first electrode conduction path 11 and a single circuit board 5 on the multilayer substrate.

Figure 6:
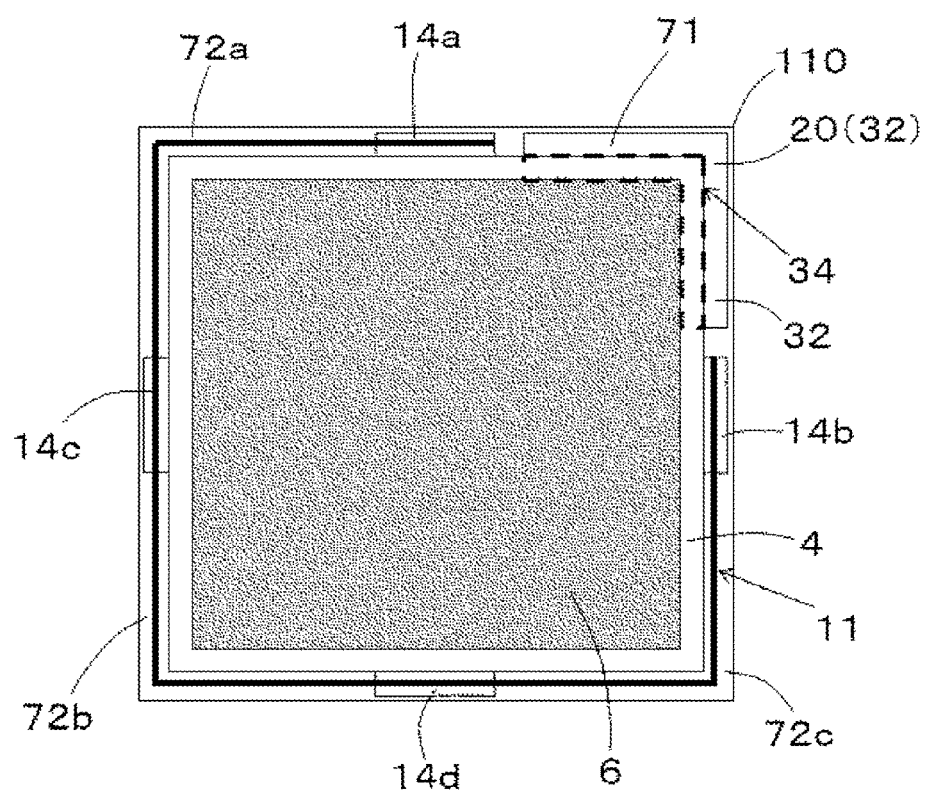
FIG. 6 is a schematic plan view illustrating a region where a first electrode conduction path 11 is formed after the heat equalizing sheet 6 shown in FIG. 5 is provided.
Figure 19:
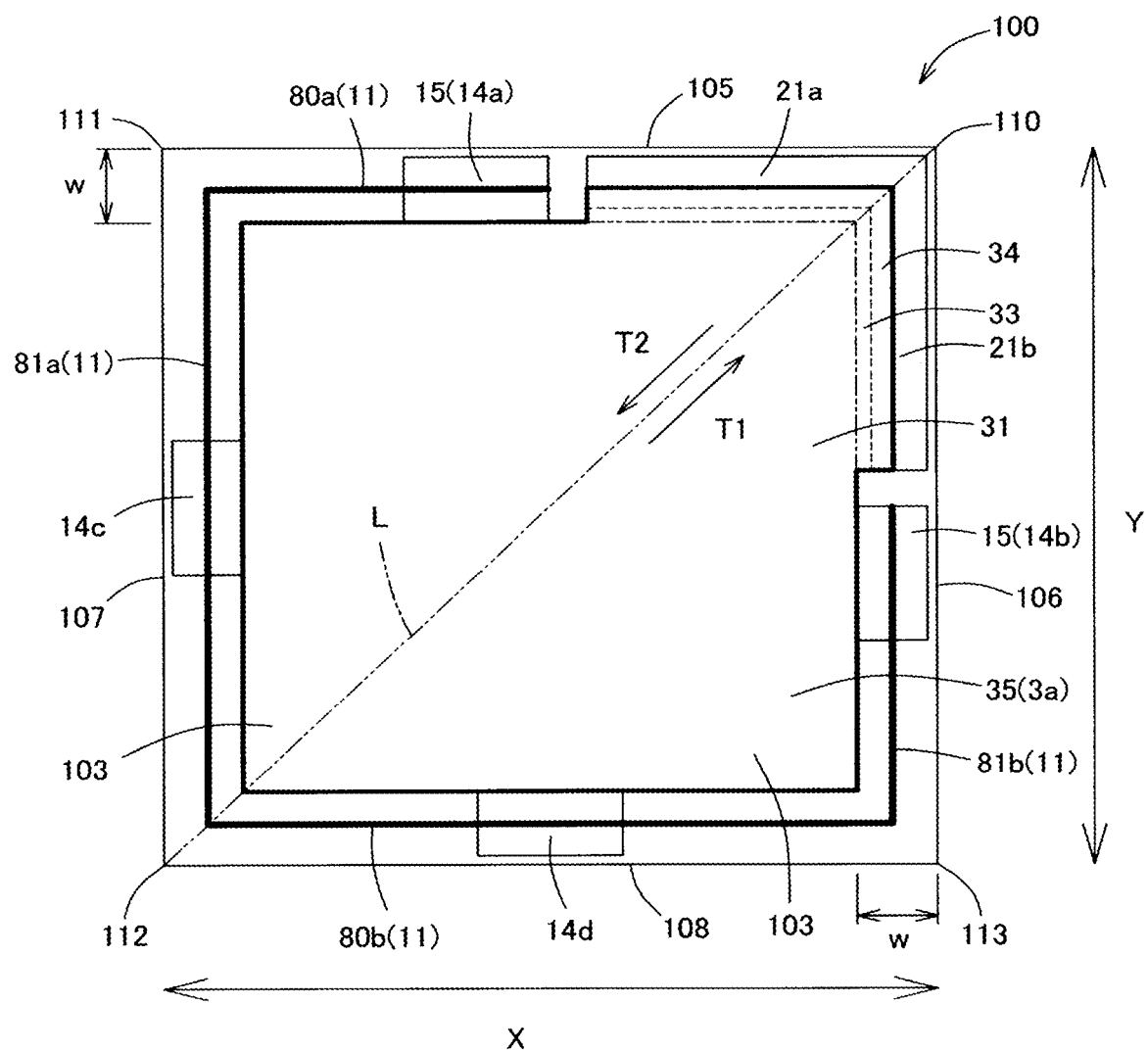
FIG. 19 is a diagram for describing each region of the organic EL panel shown in FIGS. 12A and 12B, showing the organic EL panel without the single circuit board 5 and the insulating layer 12.

As shown in FIGS. 6 and 19, the first electrode conduction path 11 has a C-shape surrounding the light-emitting region 103 when viewed in plan in the plane of the substrate 10, and the first electrode conduction path 11 is formed of a conductor.

The single circuit board 5 is fixed near one vertex 110 on the back surface 102 of the substrate 10.

As shown in FIG. 18, the organic EL panel 100 includes a non-first electrode region 17 that serves as a region other than the first electrode region 13 on the substrate 10 when viewed in plan as described later.

The non-first electrode region 17 includes four L-shaped isolated portions 71, 72 (71, 72*a* to 72*c*) isolated from the first electrode region 13 that is to be described later, as can be seen from FIGS. 1, 14, and 18.

As shown in FIG. 18, the four L-shaped isolated portions 71, 72*a* to 72*c* each have two line segments that extends from a corresponding one of the four vertices 110 to 113 of the rectangle of the organic EL panel 100 along the sides 105 to 108 of the rectangle in two directions (the horizontal direction X and the vertical direction Y) perpendicular to each other and have the same length.

Figure 7:
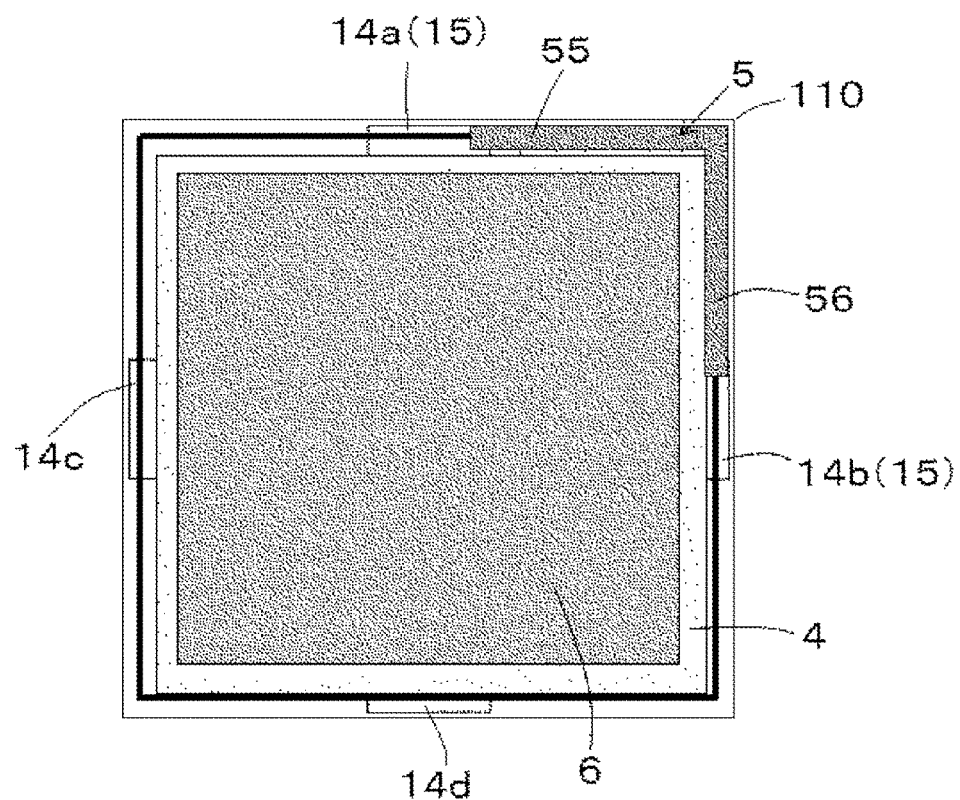
FIG. 7 is a schematic plan view illustrating a region where a single circuit board 5 is fixed after the first electrode conduction path 11 shown in FIG. 6 is formed.

As shown in FIGS. 7 and 12B, the single circuit board 5 is fixed near the L-shaped isolated portion 71 located near the one vertex 110 that is on the back surface 102 of the multilayer substrate.

As shown in FIGS. 7 and 19, it is preferable that the single circuit board 5 is fixed near the one vertex 110 on the surface of the substrate 10 and the single circuit board 5 have an L-shaped contour so as to be disposed within a width w of the L-shaped isolated portion 71 near the one vertex 110. This allows a reduction in size of the circuit board 5 and makes strength of fixing the circuit board 5 to the substrate 10 sufficiently higher while reducing cost.

Such a structure achieves low cost and high reliability, which is one of the features of the organic EL panel 100.

As shown in FIGS. 13A-13C, the organic EL panel 100 includes an organic EL element 8 formed of the first conductive film 1, the functional film 2, and the second conductive film 3 stacked in the light-emitting region 103.

In the following description, unless otherwise specified, the first conductive film 1, the functional film 2, and the second conductive film 3 that belong to the light-emitting region 103 and are the components of the organic EL element 8 are also referred to as a first electrode layer 1*a*, a functional layer 2*a*, and a second electrode layer 3*a*, respectively.

(Translucent Insulation Substrate 10)

As the translucent insulation substrate 10, any substrate may be used as long as the substrate is translucent and has insulating properties. As the translucent substrate 10, for example, a glass substrate, a film substrate, or the like is preferable, and the type of the organic EL element 8 is selected and used in accordance with its intended use.

The translucent insulation substrate 10 serves as a supporting substrate that supports each film and further serves as a sealing substrate that seals the organic EL element 8 together with the sealing film 4.

In the following description, the translucent insulation substrate 10 is also simply referred to as a substrate 10.

(First Conductive Film 1)

Figure 1:
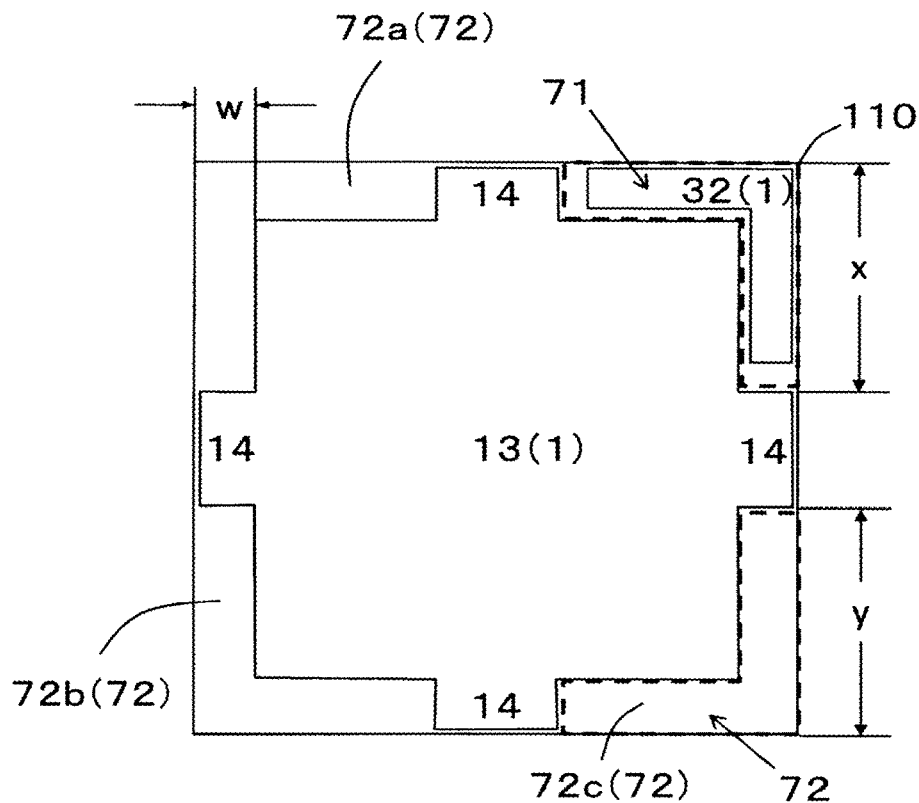
FIG. 1 is a schematic plan view illustrating each thin film forming region of a patterned first conductive film 1 formed on a back surface side of a translucent insulation substrate 10 of an organic EL panel according to an embodiment of the present invention.
Figure 14:
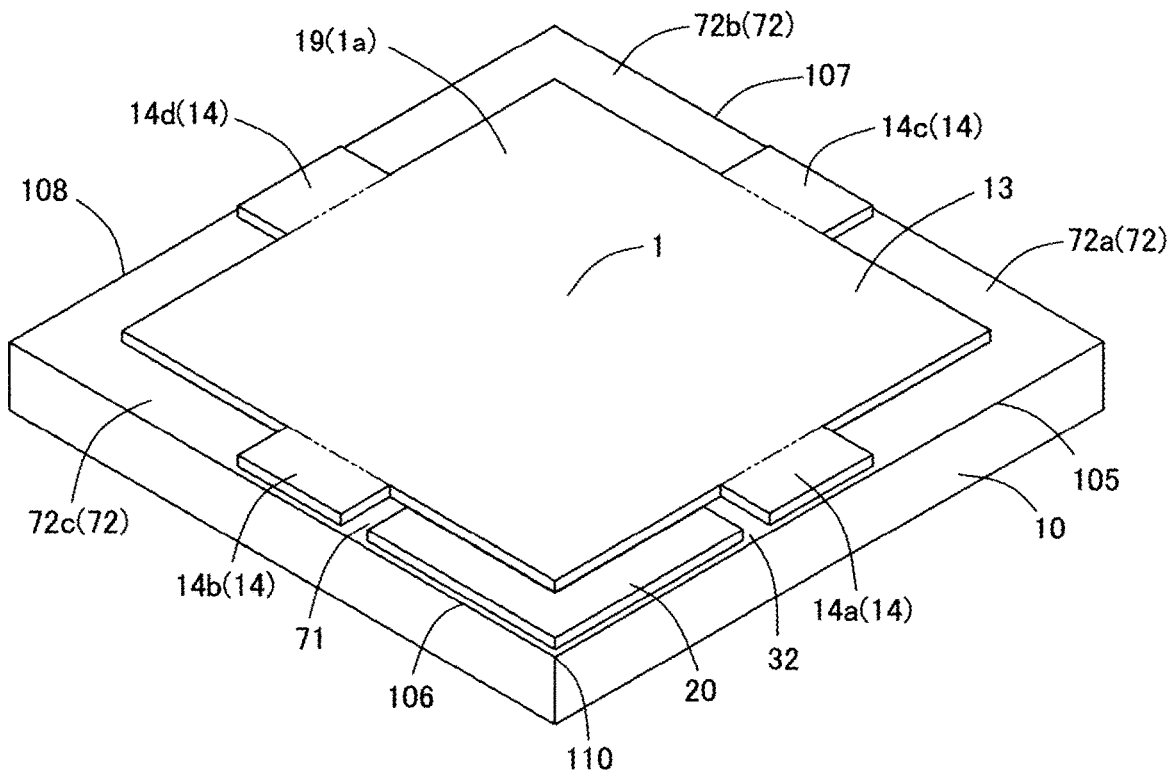
FIG. 14 is a perspective view, as viewed from the back surface side of a substrate on which the first conductive film 1 is formed in the embodiment shown in FIGS. 12A and 12B.

The first conductive film 1 is a thin film of metal oxide patterned on the back surface 102 side of the substrate 10 as shown in FIGS. 1 and 14.

As shown in FIGS. 14 and 18, the first conductive film 1 is formed in at least two types of regions within the back surface 102 side of the substrate 1, that is, the first electrode region 13 and a second electrode stretched region 32.

The first electrode region 13 is connected to a first electrode pad 14 protruding toward each of the four sides of the rectangle (from the center side toward each of the sides 105 to 108).

As shown in FIG. 14, the first conductive film 1 includes a first main body 19 and the first electrode pad 14 (14*a* to 14*d*) in the first electrode region 13.

The first main body 19 is a part belonging to the light-emitting region 103 when viewed in plan and is formed of the first electrode layer 1*a*.

As shown in FIG. 18, the first electrode pad 14*a* is a part protruding from the first main body 19 toward the first side 105. The first electrode pad 14*b* (second electrode pad) is a part protruding from the first main body 19 toward the second side 106. The first electrode pad 14*c* (third electrode pad) is a part protruding from the first main body 19 toward the third side 107. The first electrode pad 14*d* (fourth electrode pad) is a part protruding from the first main body 19 toward the fourth side 108.

As shown in FIG. 18, the first electrode pad 14*a* is provided biased from a midpoint of the first side 105 to the opposite side of the first vertex 110 in an extending direction of the first side 105. The first electrode pad 14*b* is provided biased from a midpoint of the second side 106 to the opposite side of the first vertex 110 in an extending direction of the second side 106.

In the organic EL panel 100 shown in FIG. 18, the first electrode pad 14*c* is provided at a midpoint of the third side 107 in an extending direction of the third side 107, and the first electrode pad 14*d* is provided at a midpoint of the fourth side 108 in an extending direction of the fourth side 108.

In the second electrode stretched region 32, as shown in FIGS. 1 and 14, an island portion 20 serving as a part of the first conductive film 1 is formed as an L-shaped metal oxide island in the L-shaped isolated portion 71.

The first conductive film 1 located in such regions 13, 32 is preferably formed through simultaneous formation of films of the same material from the viewpoint of cost reduction achieved by a simplified formation process.

Note that, a region other than the first electrode region 13 on the surface of the substrate 10 when viewed in plan is herein referred to as a "non-first electrode region".

Therefore, since the first electrode pad 14 is located in the first electrode region 13, the first electrode pad 14 does not belong to the non-first electrode region 17. Further, the second electrode stretched region 32 is a region where the first conductive film 1 is formed, but is located in the non-first electrode region 17.

The metal oxide of which the first conductive film 1 is formed may be preferably used as long as the metal oxide has a high translucent property and electrical conductivity.

Examples of the metal oxide include a transparent conductive oxide such as ITO or IZO, and an average thickness of the metal oxide is preferably equal to or less than 1 μm. A thin film of such a material can be formed by vacuum deposition such as CVD or PVD.

(Functional Film 2)

Figure 2:
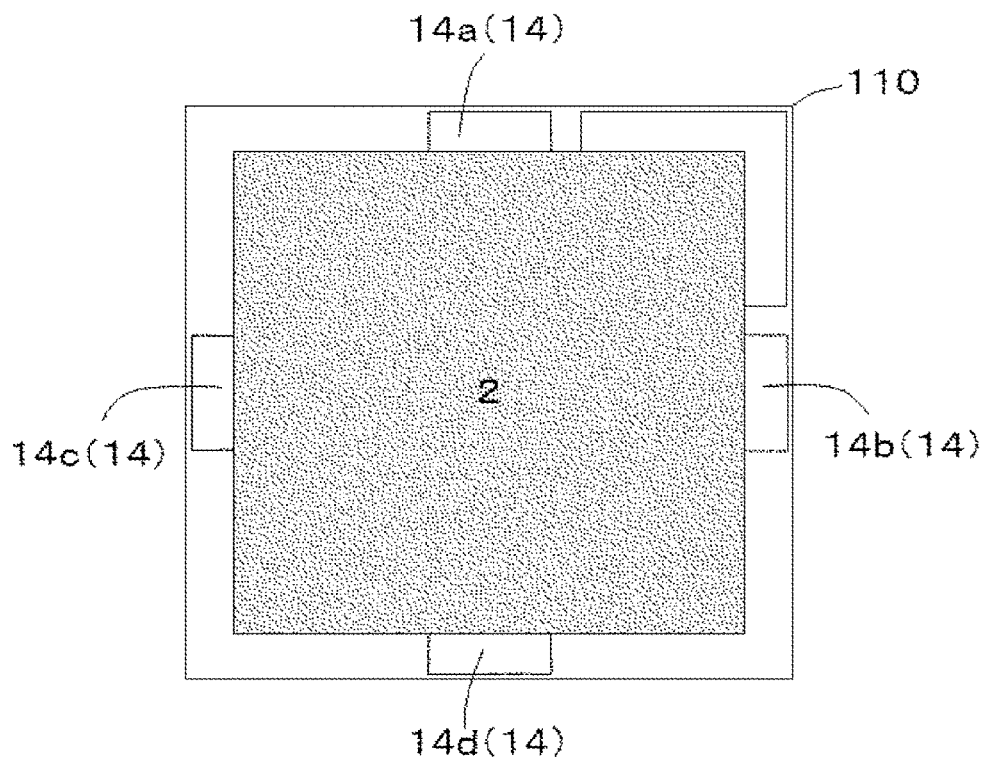
FIG. 2 is a schematic plan view illustrating a thin film forming region of a functional film 2 formed directly on the patterned first conductive film 1 shown in FIG. 1.

As shown in FIG. 2, the functional film 2 is a thin film containing an organic compound patterned on the first conductive film 1 and is an organic functional film including at least a light-emitting layer that perform a light-emitting function of the organic EL element 8.

Such a functional film 2 typically has a multilayer structure formed of, for example, a hole injection layer/hole transport layer/light-emitting layer/electron transport layer/electron injection layer stacked in this order from the first electrode layer 1a in the light-emitting region 103, and the functional film 2 may include, in addition to such layers, a connection layer including a charge generating layer, a charge block layer, or the like. A light-emitting element in which the light-emitting layer that emits light, while power is supplied from the outside to the element including this layer, is formed of a material containing at least an organic compound is herein referred to as an "organic EL element". Light emission from such a light-emitting layer may be light emission of at least one type selected from the group consisting of fluorescent light emission, phosphorescent light emission, and delayed fluorescence.

(Second Conductive Film 3)

Figure 3:
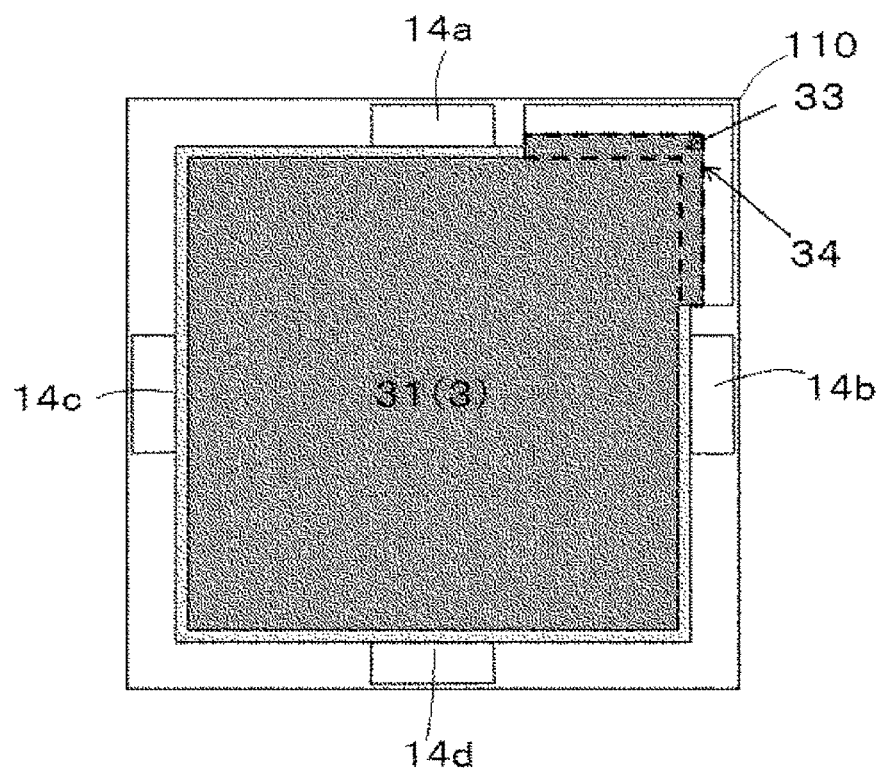
FIG. 3 is a schematic plan view illustrating a thin film forming region of a second conductive film 3 formed directly on the patterned functional film 2 shown in FIG. 2.
Figure 15:
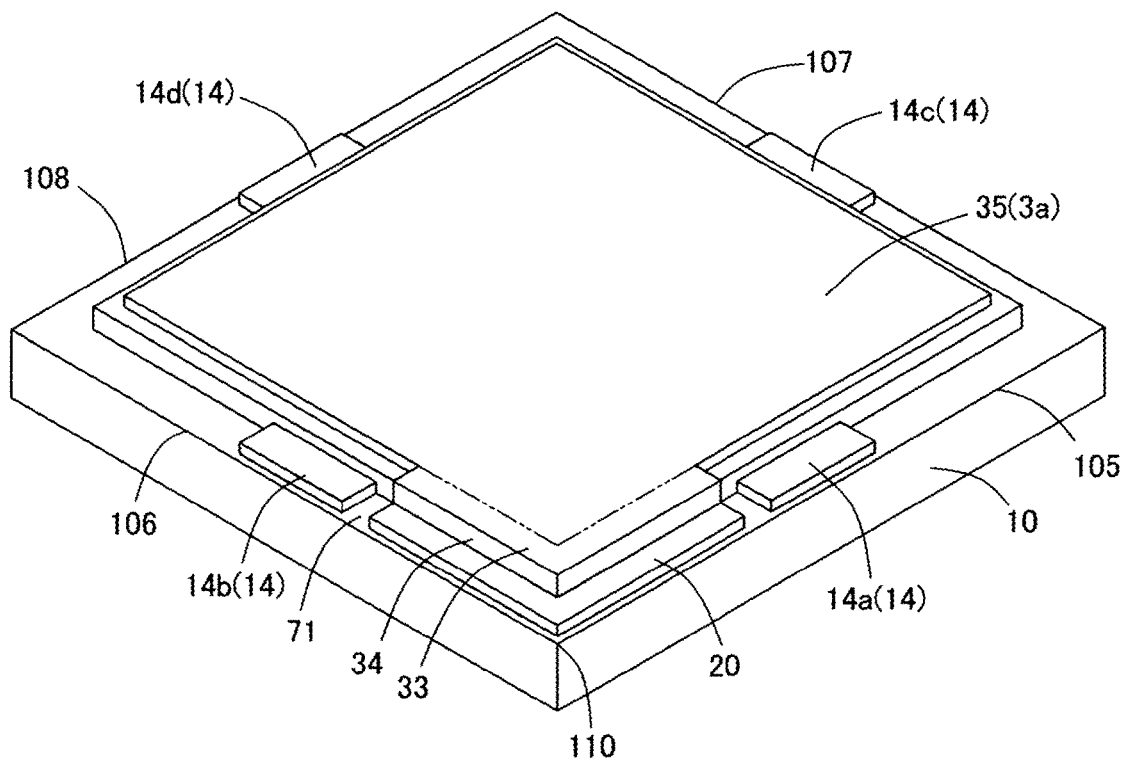
FIG. 15 is a perspective view, as viewed from the back surface side of the substrate on which the second conductive film 3 is formed in the embodiment shown in FIGS. 12A and 12B.

The second conductive film 3 is a patterned metal thin film as shown in FIGS. 3 and 15.

As shown in FIGS. 3 and 19, the second conductive film 3 includes at least a portion (second main body 35) that serves as the second electrode layer 3a of the organic EL element 8 and is formed at least in a second electrode region 31. The second electrode region 31 is connected to a second electrode pad region 33 that protrudes only toward the one vertex 110 of the rectangle.

As shown in FIGS. 3 and 19, the second conductive film 3 includes the second main body 35 and the second electrode pad region 33 in the second electrode region 31 when viewed in plan.

The second main body 35 is a quadrangular portion belonging to the light-emitting region 103 when viewed in plan and is formed of the second electrode layer 3a.

The second electrode pad region 33 is a region extending from the second main body 35 toward the vertex 110. The second electrode pad region 33 extends from the second main body 35 in an L shape along the first side 105 and the second side 106.

Herein, as shown in FIGS. 3 and 19, the second conductive film 3 has the second electrode pad region 33 overlapping with the second electrode stretched region 32 when viewed in plan, and the second electrode pad region 33 is conductively connected to the first conductive film 1 of the second electrode stretched region 32 in a stretched path region 34. That is, the stretched path region 34 is a region where the second electrode pad region 33 and the first conductive film 1 of the second electrode stretched region 32 are conductively connected to each other to form a conduction path.

The first conductive film 1, the functional film 2, and the second conductive film 3 correspond to the overlapping portion of the first electrode region 13, the functional film 2, and the second electrode region 31, respectively, when viewed in plan, and the first electrode layer 1a, the functional layer 2a, and the second electrode layer 3a are the components of the organic EL element 8 disclosed herein as this sandwich structure. That is, the organic EL element 8 is formed of the first conductive film 1, the functional film 2, and the second conductive film 3 belonging to the overlapping portion of the first electrode region 13 and the second electrode region 31.

As the material of which the second conductive film 3 is formed, aluminum or silver that is high in reflectivity and effective in increasing luminance is preferable. As the method for forming the film, vacuum vapor deposition is preferable because a high-purity film can be formed and original physical properties of the material can be easily obtained.

(Sealing Film 4)

Figure 4:
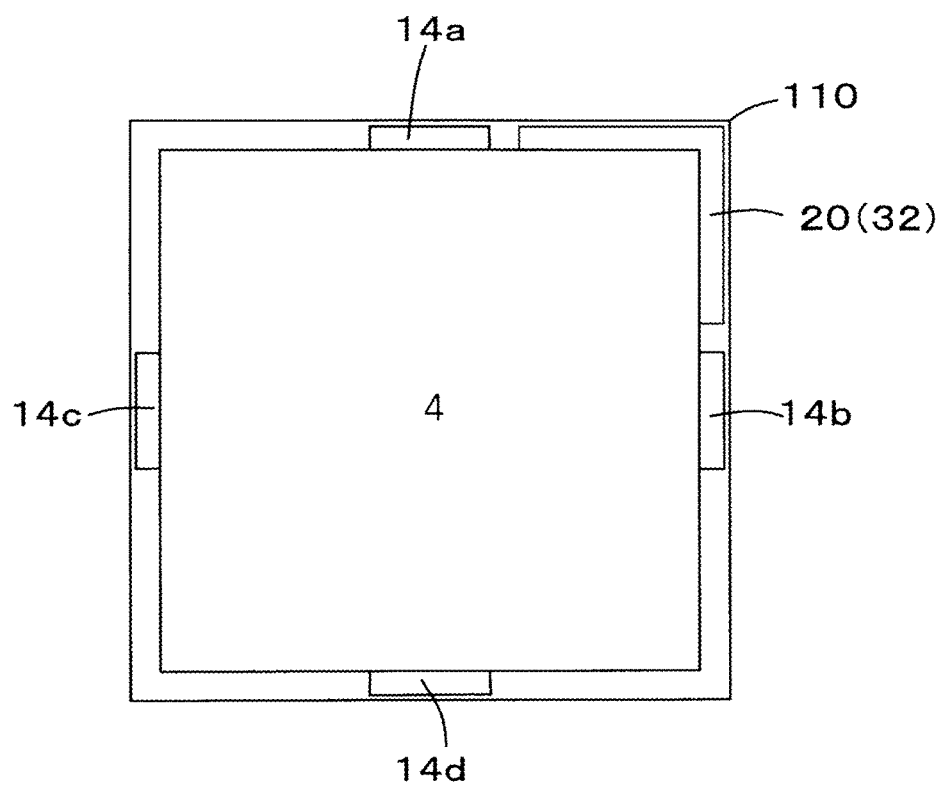
FIG. 4 is a schematic plan view illustrating a thin film forming region of a sealing film 4 formed directly on the patterned second conductive film 3 shown in FIG. 3.
Figure 5:
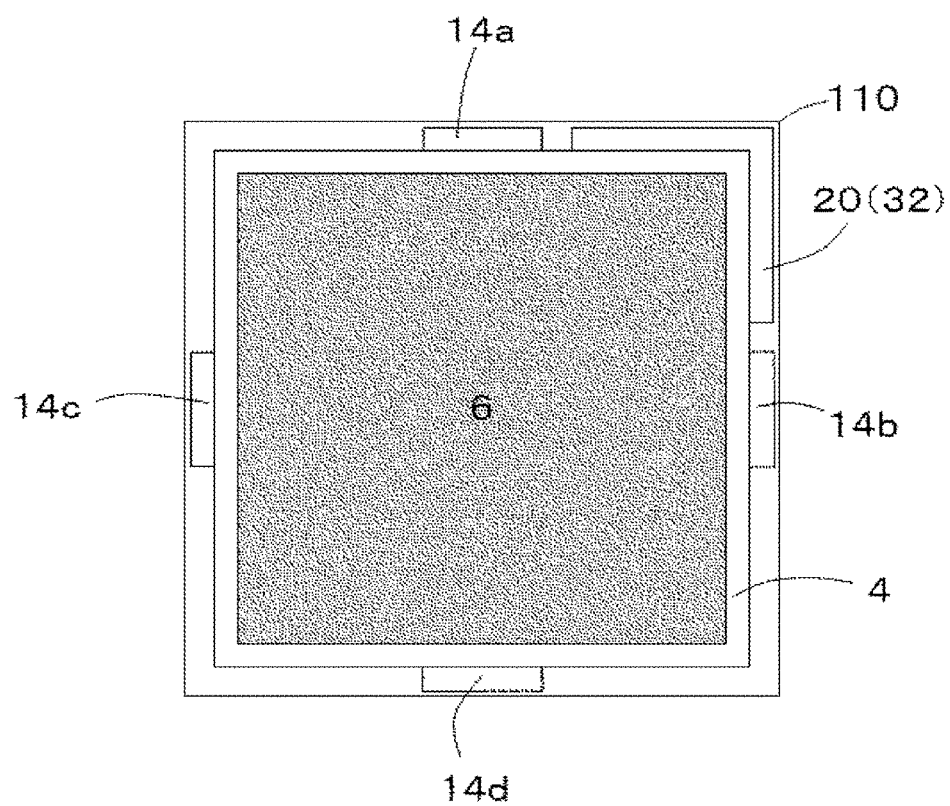
FIG. 5 is a schematic plan view illustrating a region where a heat equalizing sheet 6 is provided after the sealing film 4 shown in FIG. 4 is formed.

The sealing film 4 is a patterned thin film as shown in FIG. 4 and has an electrical insulating property and a water vapor barrier property.

As shown in FIG. 4, the sealing film 4 is laid on top of all of the first electrode region 13 excluding at least a part of the first electrode pad 14, the region where the functional film 2 is formed, and the second electrode region 31 including the second electrode pad region 33 when viewed in plan. Further, the sealing film 4 is formed so as not to be laid on top of at least a part of the second electrode stretched region 32.

That is, the sealing film 4 is laid on top of all the area of the light-emitting region 103 when viewed in plan and further covers the other part of the functional film 2 connected to the functional layer 2a belonging to the light-emitting region 103. Further, the sealing film 4 preferably covers all the area of the second electrode pad region 33. On the other hand, the sealing film 4 does not belong to the second electrode stretched region 32.

The sealing film 4 can seal the whole of the light-emitting region 103 of the organic EL panel 100, that is, the whole of the organic EL element 8 is interposed between the sealing film 4 and the substrate 10, and the sealing film 4 preferably includes an inorganic thin film layer.

An average thickness of the inorganic thin film layer is preferably in a range of from 1 μm to 10 μm, both inclusive.

As the material of the sealing film 4, an inorganic substance can be given as an example from the viewpoint of imparting a sufficient water vapor barrier property to the film.

The material of the sealing film 4 is preferably silicon oxide and/or silicon nitride, more preferably an inorganic thin film, and further preferably contains a thin film formed of a silicon-based material by CVD. It is particularly preferable that the sealing film 4 is a multilayer film containing a wet silicon-based film formed on the silicon-based thin film by CVD.

The wet silicon-based film is preferably a polysilazane conversion film, and an average film thickness of these CVD and wet silicon-based films is preferably in a range of from 0.5 μm to 5 μm.

(Heat Equalizing Sheet 6)

The organic EL panel 100 preferably includes a heat equalizing sheet 6 on a back surface 102 side of the sealing film, and more preferably includes a heat equalizing sheet 6 that covers the whole of the light-emitting region 103 when viewed in plan. The heat equalizing sheet 6 is preferably a graphite sheet having an excellent in-plane heat equalizing property.

(Non-First Electrode Region)

As shown in FIG. 18, the non-first electrode region 17 is a region other than the first electrode region 13 on the surface of the multilayer substrate when viewed in plan, and includes at least the four L-shaped isolated portions 71, 72a to 72c as partial regions.

(L-Shaped Isolated Portion 71, 72)

As shown in FIGS. 1 and 18, the L-shaped isolated portions 71, 72 (71, 72a to 72c) (the first isolated region, the second isolated region) each extend from a corresponding one of the vertices 110 to 113 of the rectangle along the sides 105 to 108 of the rectangle in two directions perpendicular to each other.

The L-shaped isolated portions 71, 72a to 72c each include two line segments having the same length, and a width of the two line segments, that is, a width from the sides 105 to 108 of the rectangle is the width w.

The L-shaped isolated portions 71, 72a to 72c are isolated from the first electrode region 13.

That is, the L-shaped isolated portions 71, 72a to 72c each include a horizontal isolated portion 75 extending in the horizontal direction X and a vertical isolated portion 76 extending in the vertical direction Y. The horizontal isolated portion 75 and the vertical isolated portion 76 are connected to each other at their respective ends and extend linearly from the connecting portion in directions orthogonal to each other. The horizontal isolated portion 75 and the vertical isolated portion 76 have the width w.

It is preferable that the horizontal isolated portion 75 of the L-shaped isolated portion 71 is equal in length in the extending direction to the vertical isolated portion 76 of the L-shaped isolated portion 71.

As shown in FIG. 14, the L-shaped isolated portions 71, 72a to 72c are located at the four corners of the rectangle, and each correspond to a region on the surface of the substrate 10 electrically insulated from the first conductive film 1 in the first electrode region 13 on the surface of the substrate 10. That is, the L-shaped isolated portions 71, 72a to 72c are regions electrically isolated from the first conductive film 1 belonging to the first electrode region 13.

The L-shaped isolated portion 71 is provided only near the one vertex 110, and the L-shaped isolated portions 72a to 72c are provided near the remaining three corners (three vertices 111 to 113) of the rectangle other than the one vertex 110.

As shown in FIGS. 6 and 18, in the second electrode stretched region 32 of the L-shaped isolated portion 71, the island portion 20 that is an island of metal oxide is provided on the back surface 102 side of the substrate 10 as a part of the first conductive film 1 when viewed in plan. That is, the first conductive film 1 includes the island-shaped island portion 20 in the second electrode stretched region 32 of the L-shaped isolated portion 71.

The island portion 20 is a base portion that serves as a base of the second electrode pad region 33 and has an "L" shape like the L-shaped isolated portion 71. That is, as shown in FIG. 18, the island portion 20 includes a first base portion 21a extending along the first side 105 and a second base portion 21b extending along the second side 106.

In the L-shaped isolated portion 72, the island portion 20 that is an island of metal oxide may be provided or need not be provided on the back surface 102 side of the substrate 10 adjacent to as a part of the first conductive film 1.

A length x, in the extending direction, of the isolated portions 75, 76 of the L-shaped isolated portion 71 may be equal to a length, in the extending direction, of the isolated portions 75, 76 of the L-shaped isolated portions 72a to 72c like the organic EL panel 100 shown in FIG. 1, but it is preferable that the length x is longer than a length y, in the extending direction, of the isolated portions 75, 76 of the L-shaped isolated portions 72a to 72c like the organic EL panel 100 shown in FIG. 18.

For example, as shown in FIG. 18, it is preferable that a length x1 of the horizontal isolated portion 75a (first isolated portion) of the L-shaped isolated portion 71 is longer than a length y1 of the horizontal isolated portion 75b (third isolated portion) of the L-shaped isolated portion 72a extending along the first side 105. Further, it is preferable that a length x2 of the vertical isolated portion 76a (second isolated portion) of the L-shaped isolated portion 71 is longer than a length y2 of the vertical isolated portion 76b (fourth isolated portion) of the L-shaped isolated portion 72c extending along the second side 106.

A length ratio x:y between the L-shaped isolated portion 71 and the L-shaped isolated portion 72 is preferably in a range of from 1:1 to 1:1.5, and more preferably in a range of from 1:1.01 to 1:1.3. That is, the lengths x1, x2 of the isolated portions 75a, 76a of the L-shaped isolated portion 71 are preferably at least one time as long as the lengths y1, y2 of the isolated portions 75b, 76b of the L-shaped isolated portions 72a, 72c, and more preferably at least 1.01 times as long as the lengths y1, y2. Similarly, the lengths x1, x2 of the isolated portions 75a, 76a are preferably at least 1.5 times as long as the lengths y1, y2 of the isolated portions 75b, 76b, and more preferably at least 1.3 times as long as the lengths y1, y2.

Such a structure suppresses unevenness in luminance caused by concentration of the current near the one vertex 110 and makes such unevenness in luminance less conspicuous over the whole light-emitting region 103.

(First Electrode Conduction Path 11)

The first electrode conduction path 11 serves as an auxiliary electrode for use in making a potential distribution width in the plane of the first electrode layer 1a small so as to reduce unevenness in luminance in the overlapping portion of the first electrode layer 1a, the functional layer 2a, and the second electrode layer 3a of the organic EL element 8 (unevenness in luminance in the light-emitting region 103).

Figure 16:
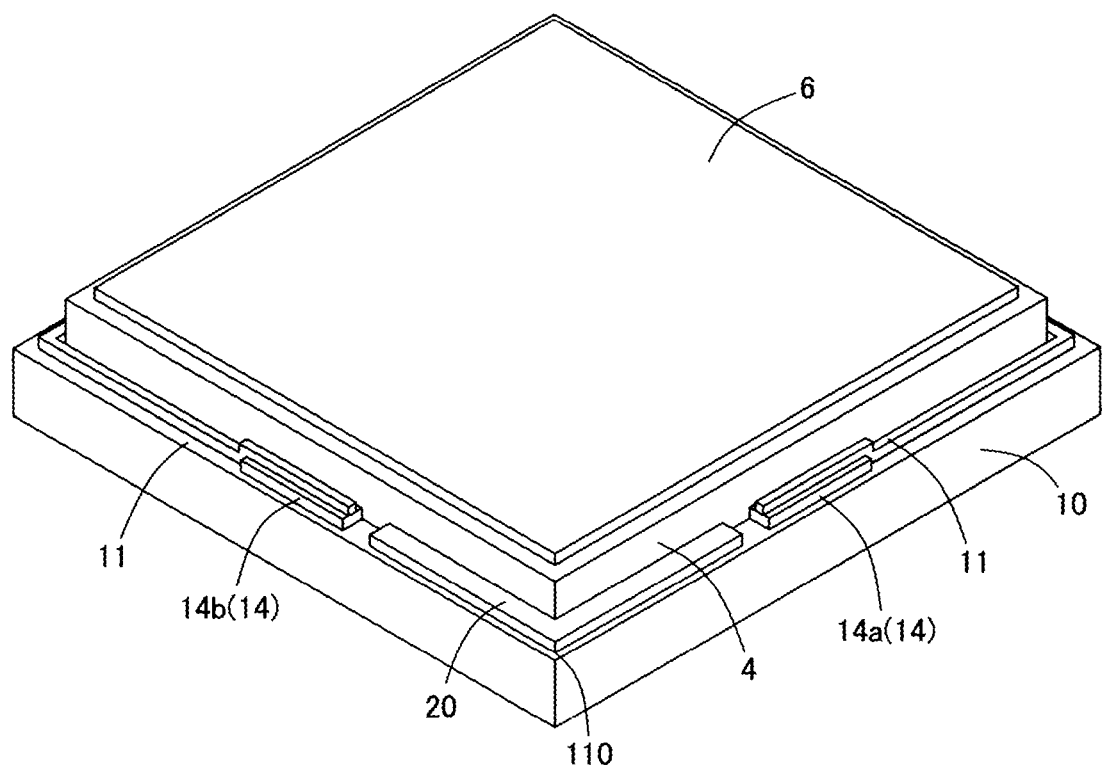
FIG. 16 is a perspective view, as viewed from the back surface side of the substrate on which the first electrode conduction path 11 is formed in the embodiment shown in FIGS. 12A and 12B.

As shown in FIGS. 6, 16, and 19, the first electrode conduction path 11 is a C-shaped electrical conduction path provided in a region other than the stretched path region 34 in the surface of the substrate 10 to surround the rectangular light-emitting region 103 when viewed in plan.

It is preferable that the first electrode conduction path 11 is electrically connected to all the first electrode pads 14 (14a to 14d) and be in direct contact with the first electrode pads 14.

In other words, when viewed in plan, the periphery of the light-emitting region 103 is surrounded by the C-shaped first electrode conduction path 11 provided on the surface of the substrate 10 other than on the stretched path region 34.

That is, the first electrode conduction path 11 is a conduction path that extends to surround at least one half of the periphery of the light-emitting region 103 when viewed in plan. It is preferable that the first electrode conduction path 11 extends to surround at least three quarters of the periphery of the light-emitting region 103 when viewed in plan.

As shown in FIG. 19, the first electrode conduction path 11 includes horizontal path portions 80a, 80b extending along the horizontal sides 105, 108 and vertical path portions 81a, 81b extending along the vertical sides 107, 106 outside the light-emitting region 103 and is continuous in the order of the path portions 80a, 81a, 80b, 81b.

The first electrode conduction path 11 is preferably made of a material that has resistivity smaller than the first conductive film 1 for reducing unevenness in luminance of the organic EL panel 100 caused by the electrical resistance of the first conductive film 1. Examples of the material of the first electrode conduction path 11 may include metals such as gold, silver, copper, chromium, molybdenum, aluminum, palladium, tin, lead, and magnesium, and alloys containing at least one of these metals.

The first electrode conduction path 11 made of such materials may be formed by a dry process such as vacuum deposition or sputtering or may be formed by a wet process such as dispenser coating, screen printing, or inkjet printing.

When the above method is applied to the design of the organic EL panel 100 and the width and thickness of the first electrode conduction path 11 can be designed considering the size of the organic EL panel 100 and the resistivity of the material of the first electrode conduction path 11, the EL panel 100 having a reduced unevenness in luminance can be realized.

The first electrode conduction path 11 according to the present embodiment is a metal wiring formed of a conductive paste.

Further, as shown in FIGS. 13A-13C and 17, it is preferable that the back surface 102 side on which the first electrode conduction path 11 is formed is covered with an insulating layer 12, and it is more preferable that the back surface 102 side is fully covered with the insulating layer 12.

(Insulating Layer 12)

The insulating layer 12 is provided so as to electrically insulate the first electrode conduction path 11.

Examples of the material of the insulating layer 12 include an organic compound having an insulating property such as polyethylene terephthalate (PET) resin, polyimide, epoxy resin, and acrylic resin, and an inorganic compound such as silicon oxide and silicon nitride. Further, examples of a method for forming the insulating layer 12 includes attachment of a sheet-shaped PET film or the like coated with an adhesive material, application and curing of a paste containing a thermosetting resin or an ultraviolet curable resin, and formation of a film of a silicon-based material by a vacuum process such as CVD.

(Single Circuit Board 5)

The single circuit board 5 is a circuit board fixed near the one vertex 110 on the surface of the substrate 10 and is preferably an only single circuit board fixed as described above. Herein, such a "single circuit board 5" is also referred to as a circuit board 5 below.

As shown in FIGS. 7 and 17, the circuit board 5 includes a horizontal circuit portion 55 extending in the horizontal direction X and a vertical circuit portion 56 extending in the vertical direction Y, and the horizontal circuit portion 55 and the vertical circuit portion 56 are connected to each other at their respective ends and extend in directions orthogonal to each other.

The horizontal circuit portion 55 is shorter in length than the first side 105 of the organic EL panel 100, and the vertical circuit portion 56 is shorter in length than the second side 106 of the organic EL panel 100.

As shown in FIG. 17, the circuit board 5 includes a first electrode wire having a first electrode wire pad 51 and a second electrode wire having a second electrode wire pad 52.

As shown in FIGS. 13A-13C and 17, the second electrode wire pad 52 of the second electrode wire is configured to adhere indirectly or directly, in a conductive manner, to the first conductive film 1 in the second electrode stretched region 32.

The first electrode wire pad 51 of the first electrode wire is configured to adhere indirectly or directly, in a conductive manner, to adjacently-holding both first electrode pads 15 corresponding to the two first electrode pads 14a, 14b which interposes the first vertex 110 in-between.

As shown in FIGS. 13A-13C and 17, it is preferable that the second electrode wire pad 52 of the second electrode wire is configured to adhere directly, in a conductive manner, to the first conductive film 1 in the second electrode stretched region 32 with a conductive adhesive 53, and that the first electrode wire pad 51 of the first electrode wire is configured to adhere directly, in a conductive manner, to the first conductive film 1 of the adjacently-holding both first electrode pads 15 with the conductive adhesive 53.

The adjacently-holding both first electrode pads 15 correspond to the two first electrode pads 14a, 14b that holds the second electrode stretched region 32 and are adjacent to the second electrode stretched region 32. That is, the circuit board 5 has the first electrode wire pad 51 provided near distal ends of the horizontal circuit portion 55 and the vertical circuit portion 56 and electrically connected to the first electrode pads 14a, 14b.

A flexible printed circuit board (FPC) can be exemplified as the circuit board 5.

It is preferable that the circuit board 5 includes the first electrode wire that has, at positions corresponding to the adjacently-holding both first electrode pads 15, 15, the first electrode wire pads 51, 51 conductively adhere to the adjacently-holding both first electrode pads 15, 15, and that the circuit board 5 include the second electrode wire that has, at a position corresponding to the second electrode stretched region 32, the second electrode wire pad 52 conductively adheres to the second electrode stretched region 32.

For conductive adhesion between the first electrode wire pad 51 of the first electrode wire and the adjacently-holding both first electrode pads 15 and as the conductive adhesive 53 for use in conductive adhesion between the second electrode wire pad 52 of the second electrode wire and the second electrode stretched region 32, an adhesive mean such as an anisotropic conductive film (ACF), solder, silver (Ag) paste, or a conductive film may be used, and further any adhesive means may be used as long as the adhesive means can make an electrical connection.

As described above, the rectangular organic EL panel 100 illustrated above includes the translucent insulation substrate 10, the light-emitting surface 101, the back surface 102 as opposite main surfaces, and the rectangular light-emitting region 103 in the center of the light-emitting surface 101. The rectangular EL panel further includes the first conductive film 1 of metal oxide, the functional film 2 containing an organic compound, the second conductive film 3 formed of metal, and the sealing film 4 having an electrical insulating property and a water vapor barrier property that are patterned thin films stacked on the translucent insulation substrate 10 in this order toward the back surface 102. The first conductive film 1 is provided on at least the first electrode region 13 connected to the first electrode pads 14a to 14d each protruding toward a corresponding one of the four sides of the rectangle, and the second electrode stretched region 32 on the surface of the substrate 10. The second conductive film 3 is provided on at least the second electrode region 31 connected to the second electrode pad region 33 protruding only toward the one vertex 110 of the rectangle. The sealing film 4 is, when viewed in plan, configured to overlap with first electrode region 13 other than the first electrode pads 14a to 14d, the region where the function film 2, is provided, and all over the second electrode region 31 including the second electrode pad region 33, and not to overlap with the second electrode region 32. The second conductive film 3 of the second electrode pad region 33 is conductively connected to the first conductive film 1 of the second electrode stretched region 32 in the stretched path region 34. The periphery of the light-emitting region 103 other than the stretched path region 34 is surrounded, when viewed in plan, by the C-shaped first electrode conduction path 11 that is in direct contact with all the first electrode pads 14a to 14d. The EL panel further includes the single circuit board 5 fixed near the one vertex 110 on the surface of the substrate 10. The single circuit board 5 includes the first electrode wire and the second electrode wire. The second electrode wire adheres, in a conductive manner, to the second electrode stretched region 32. The first electrode wire adheres, in a conductive manner, to the adjacently-holding both first electrode pads 15, 15, and the adjacently-holding both first electrode pads 15, 15 correspond to two first electrode pads 14a, 14b that holds (interposes) the second electrode stretched region 32 and are adjacent to the second electrode stretched region 32.

With this structure, power from the circuit board 5 is supplied to only a portion near the one vertex 110, and power supply to the first electrode layer 1a of metal oxide is made via the first electrode conduction path 11 provided on the periphery of the sealing film 4 except for the stretched path region 34. Therefore, a decrease in adhesive strength of the circuit board 5 due to the narrowing of the frame is compensated while reducing cost by downsizing the circuit board 5 (for example, FPC), suppressing unevenness in luminance or making unevenness in luminance less conspicuous, and maintaining higher long-term reliability with sufficiently preventing moisture from permeating into the element is ensured.

That is, the organic EL panel 100 illustrated above allows the circuit board 5 to be downsized, and thus the organic EL panel 100 is lower in cost due to above cost reduction effect, lower in unevenness in luminance, and higher in reliability. Further, even when the organic EL panel 100 illustrated above has a narrow frame as a result of enlarging the light-emitting region 103, it is possible to prevent decrease in reliability due to decrease in adhesive strength of the circuit board 5 as a result of narrowing the frame.

In the organic EL panel 100 illustrated above, the non-first electrode region 17 other than the first electrode region 13 on the plane of the substrate 10 includes the L-shaped isolated portions 71, 72a to 72c that each extend from a corresponding one of the four vertices 110 to 113 of the rectangle in directions perpendicular to each other and have two line segments having the same length, have the width w from the two line segments, and are isolated from the first electrode region 13.

This structure allows, not only an increase in area efficiency that is the area ratio of the light-emitting region 103 to the panel outer shape but also the light-emitting region 103 to be positioned in a center of the panel contour. This makes the appearance better and allows a voltage input portion related to the power supply from the outside to be evenly spaced from the panel contour, allowing the insulating property to be easily secured.

In the organic EL panel 100 illustrated above, the length x of the line segments of the L-shaped isolated portion 71 in the direction from the one vertex 110 is longer than the length y of the line segments of the L-shaped isolated portions 72a to 72c in three directions other than the direction from the one vertex 110.

This structure allows a reduction in luminance of the light-emitting region 103 near the one vertex 110 that tends to be high to the same level as luminance of the light-emitting region 103 near the vertices 111 to 113 in the three directions.

In the organic EL panel 100 illustrated above, the first conductive film 1 is further provided as an L-shaped metal oxide island in the L-shaped isolated portion 71.

With this structure, the adhesion of the first electrode conduction path 11 to the translucent insulation substrate 10 is made by using the first conductive film 1 in the same manner as the adhesion of the first electrode pads 14a to 14d. Therefore, the strength related to the adhesion can be kept approximately constant in the surface including the vicinity of the vertex 110, leading to an increase in reliability.

The organic EL panel 100 illustrated above further includes a graphite sheet on the back surface 102 side of the sealing film 4 as the heat equalizing sheet 6 covering the whole of the light-emitting region 103 when viewed in plan.

This structure allows unevenness in temperature in the light-emitting region 103 to be minimized, so that the unevenness in luminance can be further reduced.

In the organic EL panel 100 illustrated above, unevenness in luminance corresponding to the width of luminance distribution on the surface of the light-emitting region 103 when lighted is small.

In order to reduce the unevenness in luminance, an example can be given where local potential distribution in the organic EL panel 100 is handled as follows.

For example, when the organic EL panel 100 is lighted, on the diagonal line L (see FIG. 18) of the light-emitting region 103 extending in an opposite direction T2 toward an opposite vertex 112, the opposite direction T2 being opposite to a direction T1 of the one vertex 110 in the light-emitting region 103 (direction toward the one vertex 110 when viewed from the center), from the opposite vertex 112 of the rectangle to the one vertex 110, a local potential in both the first electrode region 13 and the second electrode region 31 first rises, with a upwardly convex profile, to its local maximum point over a short period in the opposite direction T2, lowers, and then rises, with a downwardly convex profile, over a longer period.

That is, making profiles of the respective potential distributions in the first electrode region 13 and the second electrode region 31 identical or approximate to each other allows a potential difference V at a corresponding local point in the first electrode region 13 and the second electrode region 31 to be kept constant. As a result, a voltage is uniformly applied to the functional film 2 in the light-emitting region 103 even at any position, and unevenness in luminance is made small accordingly, allowing in-plane unevenness in luminance to be reduced to a level equal to or less than the level of the panel in the related art.

Figure 20:
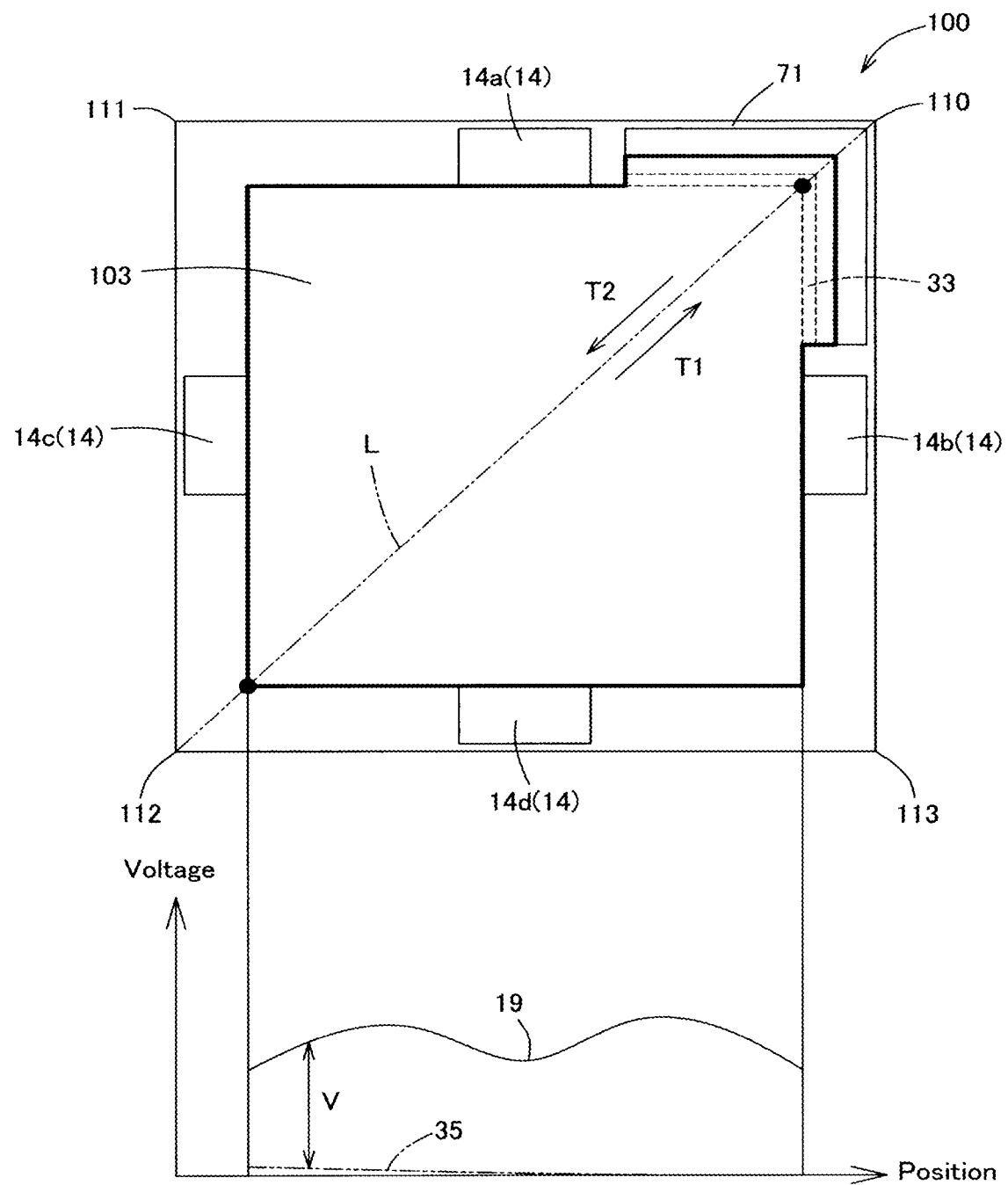
FIG. 20 is a diagram for describing potential distribution in the organic EL panel shown in FIG. 1, wherein the upper figure is a plan view showing only a main part, and wherein the lower figure is a graph showing a potential at each position on a diagonal line L.
Figure 21:
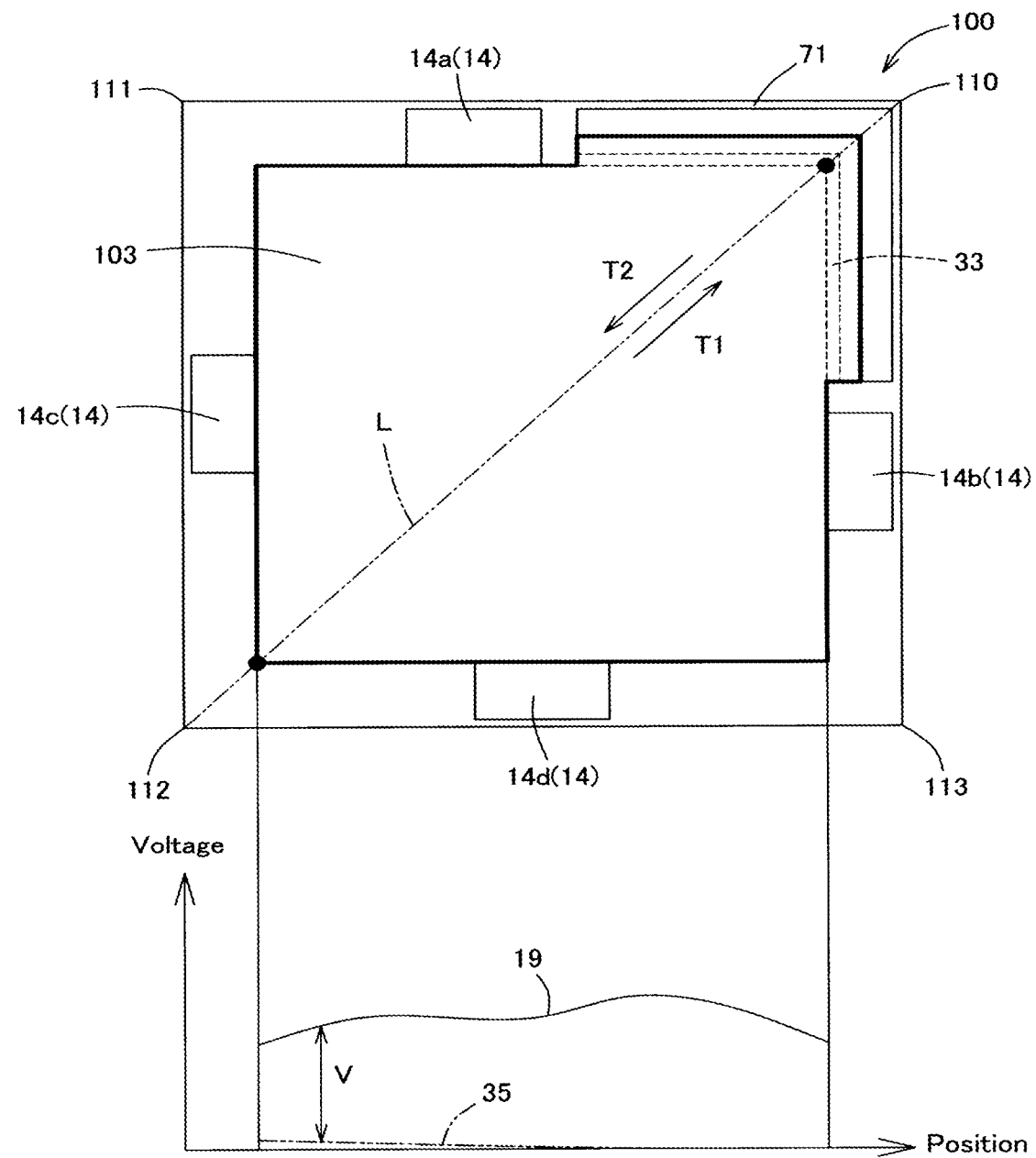
FIG. 21 is a diagram for describing potential distribution in the organic EL panel shown in FIGS. 12A and 12B, wherein the upper figure is a plan view showing only the main part, and wherein the lower figure is a graph showing a potential at each position on the diagonal line L.

In the organic EL panel 100 illustrated in FIG. 21, as compared to the structure where the lengths x1, x2 of the isolated portions 75, 76 of the L-shaped isolated portion 71 are equal to the lengths y1, y2 of the isolated portions 75, 76 of the L-shaped isolated portions 72a, 72c (FIG. 20), the first electrode pads 14a, 14b are shifted away from the vertex 110, and the width of the second electrode pad region 33 increases accordingly. Therefore, the local maximum point close to the vertex 110 of the potential distribution on the diagonal line L of the first electrode layer 1a shifts further away from the vertex 110, and a rising edge of the potential distribution on the diagonal line L of the second electrode layer 3a also shifts further away from the vertex 110. As a result, it is possible to suppress the concentration of the current near the vertex 110, and it is thus possible to reduce the unevenness in luminance in the light-emitting region 103.

Further, in the organic EL panel 100 illustrated in FIG. 21, when viewed in plan, potential distribution on the diagonal line L passing through the first vertex 110 of the first main body 19 of the first conductive film 1 has two local maximum points and a local minimum point located between the two local maximum points when the organic EL panel 100 is lighted, and the local minimum point is located remote from the first vertex 110 (adjacent to the opposite vertex 112) relative to the center.

Therefore, as compared to the organic EL panel 100 illustrated in FIG. 20, the potential distribution is smoothed, and the unevenness in luminance can be reduced accordingly.

According to the above-described embodiments, the island portion 20 is formed as a base in the second electrode stretched region 32 of the L-shaped isolated portion 71, but the present invention is not limited to such a structure. For example, when adhesiveness between the second conductive film 3 and the substrate 10 is strong enough, the island portion 20 need not be provided.

According to the above-described embodiments, the length x of the L-shaped isolated portion 71 is adjusted in order to adjust peak positions of the respective potential distributions in the first electrode layer 1a and the second electrode layer 3a, but the present invention is not limited to such a structure. For example, in order to adjust the respective potential distributions in the first electrode layer 1a and the second electrode layer 3a, the potential difference between the first electrode pads 14a, 14b and the first electrode pads 14c, 14d may be increased by adjustments to the resistance of the first electrode conduction path 11, or the number of the first electrode pads 14 may be adjusted.

According to the above-described embodiments, a description has been given of the structure where the first conductive film 1 is a thin film of metal oxide, the second conductive film 3 is a thin film of metal, and the sheet resistance of the second conductive film 3 is extremely small as compared to the sheet resistance of the first conductive film 1, but the present invention is not limited to such a structure. When a difference between the sheet resistance of the first conductive film 1 and the sheet resistance of the second conductive film 3 is small, it is preferable that the position or number of the first electrode pads 14 or the area or shape of the second electrode pad region 33 is adjusted so as to make the profile of the potential distribution on the diagonal line L of the first electrode layer 1a and the profile of the potential distribution on the diagonal line L of the second electrode layer 3a approximate to each other to cause the potential difference V at each position on the diagonal line L of the first electrode layer 1a and the second electrode layer 3a to fall within a certain range.

According to the above-described embodiments, the organic EL panel 100 has a rectangular shape, but the present invention is not limited to such a structure. The organic EL panel 100 may have a different shape, for example, a polygonal shape such as a triangle shape, a pentagonal shape, or a hexagonal shape, as long as the shape has at least one vertex 110, and among these, a regular polygonal shape is preferable.

According to the above-described embodiments, a description has been given of the structure where the organic EL panel 100 is of a bottle emission type, but the present invention is not limited to such a structure. The organic EL panel 100 may be of a top emission type.

As long as the above-described embodiments fall within the technical scope of the present invention, each component may be freely replaced or added between the embodiments.

EXAMPLE

Hereinafter, a detail description will be given of the present invention with reference to examples, but the present invention is not limited to such examples.

Example 1

First, a substrate with a transparent electrode having an indium tin oxide (hereinafter abbreviated as ITO) film formed on the surface as the first conductive film 1 was prepared on a glass substrate having a size of 9 cm*9 cm in length and width. Here, the ITO film was patterned, and accordingly an element forming substrate was produced.

Next, as the functional film 2 (organic functional layer), the hole injection layer/hole transport layer/light-emitting layer/electron transport layer/electron injection layer were formed on the ITO film in an 8 cm*8 cm region in a center of the element forming substrate by using a mask. Further, a laminate containing the organic EL element was formed by using an aluminum (Al) film serving as the second conductive film 3 with a different mask for forming the second conductive film 3. Furthermore, the inorganic sealing film 4 was formed using a different mask for forming the sealing film 4 so as to cover the whole of the organic EL element.

Note that the length and width of the line segments of the L-shaped isolated portions 71, 72 were formed by patterning the first conductive film 1, the second conductive film 3, and the sealing film 4. According to this example, the length x of the line segment of the L-shaped isolated portion 71 was 20 mm, the length y of the line segment of the L-shaped isolated portion 72 was 20 mm, and the width w from the line segment was 2.5 mm for both the L-shaped isolated portions 71, 72.

Next, as the first electrode conduction path 11, a power supply wiring having a length of 310 mm, a width of 1.3 mm, and a resistance of 1Ω was prepared by painting, with a dispenser, silver paste having a specific resistance of $2*10^{-5}$ Ω·cm onto the periphery of the light-emitting region 103 other than the stretched path region 34 so as to bring the silver paste into contact with all the first electrode pads 14, and drying the silver paste with heat of 95° C. for one hour.

Subsequently, a PET film with an adhesive layer having a thickness of 50 μm was attached to the power supply wiring to prepare the insulating layer 12 for use in electrically insulating the power supply wiring.

Next, as the circuit board 5, an L-shaped FPC (having a line segment length of 35 mm) including the first electrode wire and the second electrode wire and formed of two line segments with the same length was prepared. The FPC was heat-bonded using an anisotropic conductive film (ACF) as the conductive adhesive 53 such that the second electrode wire pad 52 of the second electrode wire is electrically connected to the second electrode stretched region 32 and the first electrode wire pad 51 of the first electrode wire is electrically connected to the adjacently-holding both first electrode pads 15.

As described above, as Example 1, the organic EL panel including the FPC serving as the circuit board 5 provided only at the one vertex of the rectangular organic EL panel was produced.

Example 2

According to Example 2, since the length x of the line segment of the L-shaped isolated portion 71 in Example 1 was set to 25 mm and the length of the line segment of the L-shaped FPC was accordingly set to 40 mm, the organic EL element and the inorganic sealing layer were formed as in Example 1, and thus an organic EL panel according to Example 2 was produced.

As described above, as Example 2, the organic EL panel including the FPC serving as the circuit board 5 provided only at the one vertex of the rectangular organic EL panel and in which the length x of the line segment of the L-shaped isolated portion 71 is longer than the lengthy of the line segment of the L-shaped isolated portion 72 by 5 mm was produced.

Comparative Example

Figure 8:
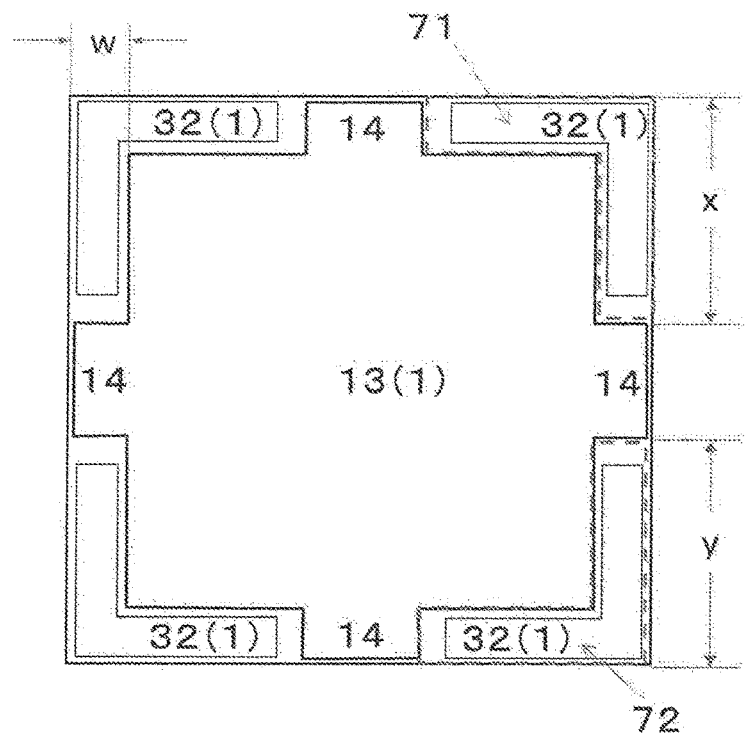
FIG. 8 is a schematic plan view illustrating each thin film forming region of a patterned first conductive film 1 formed on a back surface side of a translucent insulation substrate 10 of an organic EL panel according to Comparative Example.
Figure 9:
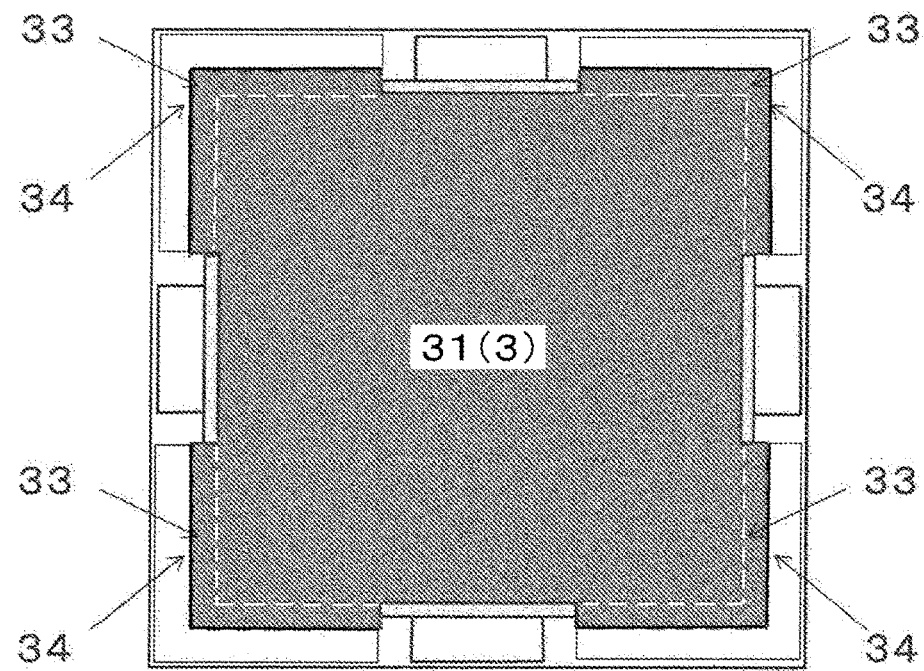
FIG. 9 is a schematic plan view illustrating a region where a second conductive film 3 is formed after FIG. 8.
Figure 10:
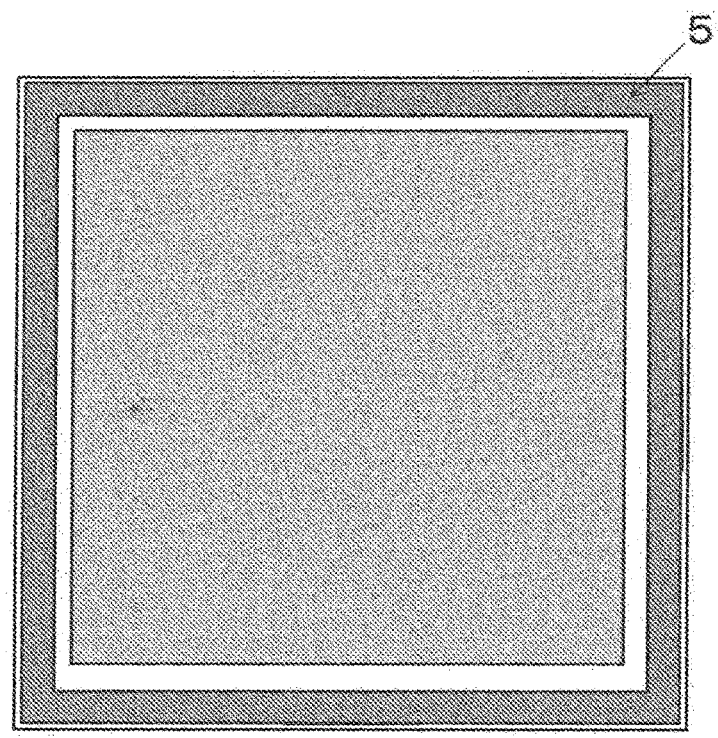
FIG. 10 is a schematic plan view illustrating a region where a square-shaped FPC is attached by pressure after FIG. 9.

In Comparative Example, as shown in FIGS. 8 and 9, the pattern of ITO of the first conductive film 1 and the pattern of Al of the second conductive film 3 were changed such that the second electrode stretched region 32, the second electrode pad region 33, and the stretched path region 34 in Example 1 are formed at all four vertices of the rectangular organic EL panel. Further, in Comparative Example, as shown in FIG. 10, the silver paste of the first electrode conduction path 11 and the PET film of the insulating layer 12 in Example 1 were not formed. Further, in Comparative Example, as the circuit board 5, a square-shaped FPC including a second electrode wire corresponding to the second electrode stretched region 32 at four vertices and a first electrode wire corresponding to the first electrode pads 14 on all four sides was heat-bonded to the whole periphery of the light-emitting region using ACF.

As described above, as Comparative Example, the organic EL panel having the FPC provided all around the rectangular organic EL panel was produced.

Figure 11:
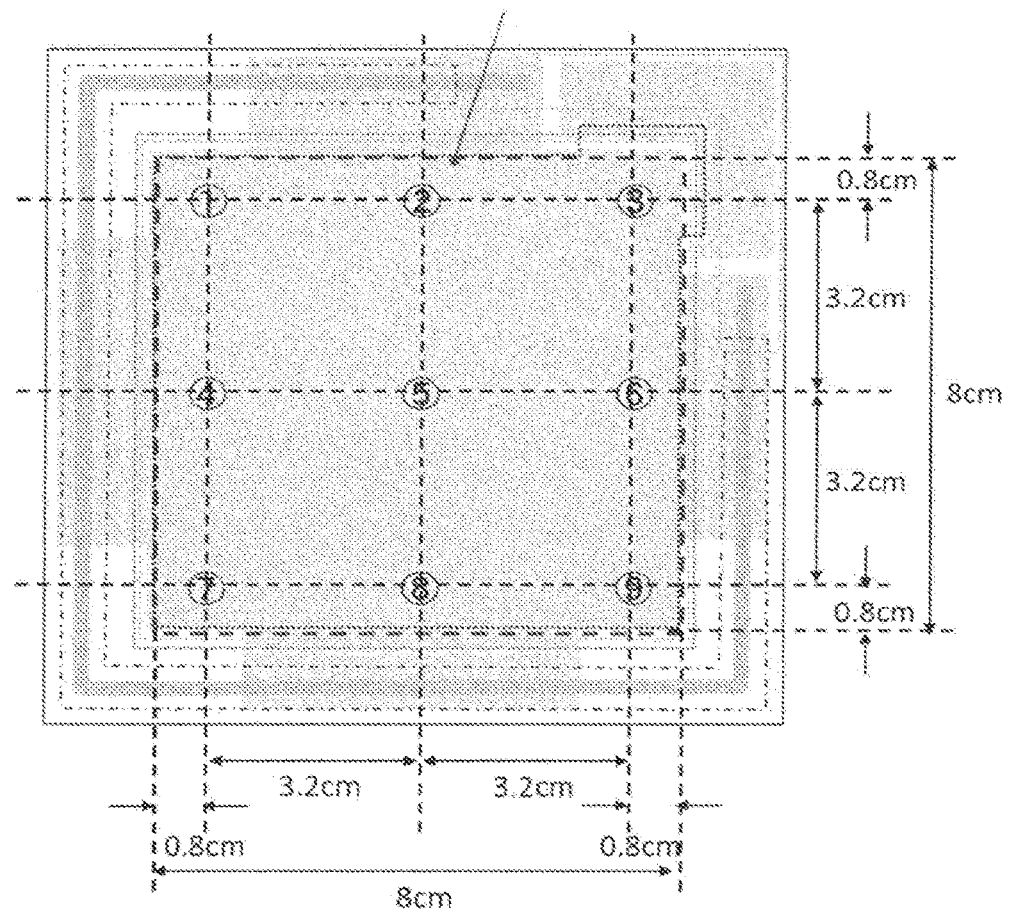
FIG. 11 is a diagram for describing luminance measurement points in an organic EL panels according to examples 1, 2 and Comparative Example and is a plan view of Example 2.

A constant current of 4.5 mA/cm² was applied to the organic EL panels of Examples 1, 2 and Comparative Example via the FPC, luminance at nine points in the plane of each organic EL panel shown in FIG. 11 was measured by a luminance meter, a degree of in-plane uniformity in luminance (%) is calculated by the following (Equation 1), and degrees of in-plane uniformity in luminance of Example 1, Example 2, and Comparative Example were compared. Note that FIG. 11 is a plan view of Example 2.

[Math Expression 1]

In-plane uniformity in luminance (%)={1−(maximum luminance at nine points−minimum luminance at nine points)÷(maximum luminance at nine points+minimum luminance at nine points) }×100 [Math Expression 1]

Table 1 shows, in a collective manner, results of the comparison of the degrees of in-plane uniformity in luminance of Example 1, Example 2, and Comparative Example (uniformity in luminance at nine points).

TABLE 1

|  | EXAMPLE 1 | EXAMPLE 2 | COMPARATIVE EXAMPLE |
|---|---|---|---|
| UNIFORMITY IN LUMINANCE AT NINE POINTS | 87% | 89% | 89% |

Furthermore, production costs of the organic EL panels of Examples 1, 2 and Comparative Example were compared. Table 2 shows, in a collective manner, results of the comparison of the production costs of the organic EL panels of Examples 1, 2 and Comparative Example.

TABLE 2

|  | EXAMPLE 1 | EXAMPLE 2 | COMPARATIVE EXAMPLE |
|---|---|---|---|
| PRODUCTION COST | 1400 yen | 1400 yen | 1600 yen |

As is clear from Table 1, the organic EL panel of Example 2 in which the length x of the line segment of the L-shaped isolated portion 71 is longer than the length y of the line segment of the L-shaped isolated portion 72 by 5 mm showed an improvement in uniformity in luminance due to a reduction in current concentration near the one vertex where the L-shaped FPC is provided as compared to the organic EL panel of Example 1 in which the length x of the line segment of the L-shaped isolated portion 71 is equal to the lengthy of the line segment of the L-shaped isolated portion 72. Further, the organic EL panel of Example 2 became equivalent in in-plane uniformity in luminance to the organic EL panel of Comparative Example in which the FPC was provided all around the rectangular organic EL panel.

Furthermore, since the organic EL panels of Examples 1, 2 are each provided with the FPC only at the one vertex of the rectangular organic EL panel, a production cost for the FPC and ACF could be significantly reduced as compared to the organic EL panel of Comparative Example in which the FPC is provided all around the rectangular organic EL panel. Further, a production cost for the power supply wiring formed of silver paste and insulating layer of Examples 1, 2 is about one tenth of the production cost for the FPC and ACF thus reduced, and as shown in Table 2, it is thus possible to reduce a total production cost for the organic EL panel.

From the above results, the examples of the present invention allowed both the cost reduction by downsizing the circuit board (FPC) and the suppression of unevenness in luminance.

Further, although the FPCs of Examples 1, 2 are small in size and adhesion area, such a small adhesion area reduces stress generated due to a difference in coefficient of linear expansion from the substrate caused by changes in temperature, so that the panels of Examples 1, 2 are superior in long-term reliability to the panel of Comparative Example in which the FPC having a large area adheres. Further, the panels of Examples 1, 2 have the FPC adhering along two sides perpendicular to each other and thus compared favorably in resistance to mechanical impact from the outside such as tensile stress with the panel of Comparative Example.

EXPLANATION OF REFERENCE CHARACTERS

10: translucent insulation substrate
1: first conductive film
11: first electrode conduction path
12: Insulating layer
13: first electrode region
14: first electrode pad
14a: first electrode pad
14b: first electrode pad (second electrode pad)
14c: first electrode pad (third electrode pad)
14d: first electrode pad (fourth electrode pad)
15: adjacently-holding both first electrode pad
2: functional film
3: second conductive film
31: second electrode region
32: second electrode stretched region
33: second electrode pad region
34: stretched path region
4: sealing film
5: circuit board
51: first electrode wire pad
52: second electrode wire pad
6: heat equalizing sheet (graphite sheet)
71: L-shaped isolated portion (first isolated region) having L-shaped metal oxide island formed therein and having line segment with length x
72: L-shaped isolated portion having line segment with length y (second isolated region)
75a: horizontal isolated portion of L-shaped isolated portion 71 (first isolated portion)
75b: horizontal isolated portion of L-shaped isolated portion 72a (third isolated portion)
76a: vertical isolated portion of L-shaped isolated portion 71 (second isolated portion)
76b: vertical isolated portion of L-shaped isolated portion 72c (fourth isolated portion)
8: conductive adhesive

The invention claimed is:

1. An organic EL panel comprising a light-emitting surface and a back surface as opposite main surfaces, the organic EL panel comprising a first side and a second side adjacent to each other with a first vertex interposed therebetween when viewed in plan, the organic EL panel comprising a light-emitting region in a center of the light-emitting surface,
the organic EL panel comprising:
a first conductive film;
an organic functional film;
a second conductive film; and
a sealing film, each of the films being patterned and provided on a substrate in this order toward the back surface of the organic EL panel;
the organic EL panel further comprising at least a first electrode region and a second electrode stretched region when viewed in plan,
wherein the first conductive film, when viewed in plan, comprises in the first electrode region:
a first main body overlapping with the light-emitting region;
a first electrode pad protruding from the first main body toward the first side; and
a second electrode pad protruding from the first main body toward the second side, the first and the second electrode pads being connected continuously through the first main body,
wherein the second conductive film, when viewed in plan, comprises:
a second main body overlapping with the light-emitting region; and
a second electrode pad region protruding from the second main body toward the first vertex to reach the second electrode stretched region,
wherein the sealing film does not overlap with the second electrode stretched region whereas the sealing film overlaps completely with the light-emitting region when viewed in plan,
the sealing film further covering other part of the organic functional film connected continuously to the organic functional film overlapping with the light-emitting region; and
wherein the organic EL panel comprises a first electrode conduction path and a circuit board,
the first electrode conduction path extending, when viewed in plan, to surround at least one half of a periphery of the light-emitting region, so that the first electrode conduction path connects the first electrode pad and the second electrode pad,
the circuit board that is fixed near the first vertex comprising a first electrode wire and a second electrode wire,
the first electrode wire being configured to adhere, in a conductive manner, to the first electrode pad and the second electrode pad,
the second electrode wire being configured to adhere directly or indirectly, in a conductive manner, to the second electrode pad region in the second electrode stretched region.

2. The organic EL panel according to claim 1 comprising a third side adjacent to the first side with a second vertex interposed therebetween when viewed in plan,
the organic EL panel further comprising a first isolated region and a second isolated region, both isolated from the first electrode region,
the first isolated region comprising a first isolated portion extending from the first vertex to the first electrode pad along the first side and a second isolated portion extending from the first vertex to the second electrode pad along the second side,
the second isolated region comprising a third isolated portion extending from the second vertex to the first electrode pad along the first side,
the first isolated portion being longer than the third isolated portion.

3. The organic EL panel according to claim 2, wherein the first isolated portion is equal in length to the second isolated portion.

4. The organic EL panel according to claim 2, wherein the first isolated portion is equal in width to the second isolated portion.

5. The organic EL panel according to any one of claim 1, further comprising a first isolated region isolated from the first electrode region,
wherein the first conductive film formed of metal oxide comprises an island portion electrically separated from the first electrode region in the first isolated region,
wherein the second electrode stretched region belongs to part of the first isolated region,
wherein the island portion is configured to adhere to the second electrode pad region in the second electrode stretched region, and wherein the second electrode wire is configured to adhere, in a conductive manner, to the second electrode pad region or the island portion in the second electrode stretched region.

6. The organic EL panel according to claim 1, further comprising a heat equalizing sheet provided on a back surface side of the sealing film,
wherein the heat equalizing sheet is a graphite sheet and overlaps completely with the light-emitting region when viewed in plan.

7. The organic EL panel according to claim 1,
wherein the first electrode pad is located at a biased position from a midpoint of the first side towards opposite to the first vertex in an extending direction of the first side, and
wherein the second electrode pad is located at a biased position from a midpoint of the second side towards opposite to the first vertex in an extending direction of the second side.

8. The organic EL panel according to claim 7 having a rectangular shape or a square shape with the first side, the second side, a third side, and a fourth side serving as each side when viewed in plan, the organic EL panel further comprising:
a third electrode pad protruding from the first main body toward the third side; and
a fourth electrode pad protruding from the first main body toward the fourth side,
wherein the first electrode pad, the second electrode pad, the third electrode pad, and the fourth electrode pad are connected continuously through the first main body,
the third electrode pad being located near a midpoint of the third side in an extending direction of the third side,
the fourth electrode pad being located near a midpoint of the fourth side in an extending direction of the fourth side.

9. The organic EL panel according to claim 1, having a rectangular shape or a square shape when viewed in plan, the organic EL panel further comprising a first isolated region and a second isolated region isolated from the first electrode region,
wherein the first isolated region comprises a first isolated portion extending from the first vertex to the first electrode pad along the first side and a second isolated portion extending from the first vertex to the second electrode pad along the second side,
wherein potential distribution in the first main body has: when lighted, two local maximum points; and
a local minimum point located between the two local maximum points on a diagonal line passing through the first vertex when viewed in plan, and
wherein the local minimum point is located at a position opposite to the first vertex from the center of the first main body portion on the diagonal line.

10. An organic EL panel comprising a light-emitting surface and a back surface as opposite main surfaces, the organic EL panel with a shape of a quadrangle comprising a first, second, third, and fourth sides when viewed in plan, the adjacent first and second sides interposing a first vertex therebetween, the organic EL panel comprising a light-emitting region in a center of the light-emitting surface,
the organic EL panel comprising:
a first conductive film;
an organic functional film;
a second conductive film; and
a sealing film, each of the films being patterned and provided on a substrate in this order toward the back surface of the organic EL panel;
the organic EL panel further comprising at least a first electrode region and a second electrode stretched region when viewed in plan,
wherein the first conductive film comprises in the first electrode region:
a first main body overlapping with the light-emitting region;
a first electrode pad protruding from the first main body toward the first side;
a second electrode pad protruding from the first main body toward the second side;
a third electrode pad protruding from the first main body toward the third side; and
a fourth electrode pad protruding from the first main body toward the fourth side, the first, the second, the third, and the fourth electrode pads being connected continuously through the first main body,
wherein the second conductive film, when viewed in plan, comprises:
a second main body overlapping with the light-emitting region; and
a second electrode pad region protruding from the second main body toward the first vertex to reach the second electrode stretched region,
wherein the sealing film does not overlap with the second electrode stretched region whereas the sealing film overlaps completely with the light-emitting region when viewed in plan,
the sealing film further covering the second electrode pad region and other part of the organic functional film connected continuously to the organic functional film overlapping with the light-emitting region, and
wherein the organic EL panel comprises a first electrode conduction path and a circuit board,
the first electrode conduction path extending, when viewed in plan, to surround at least one half of a periphery of the light-emitting region, so that the first electrode conduction path connects the first, the second, the third, and the fourth electrode pads,
the circuit board that is fixed near the first vertex comprising a first electrode wire and a second electrode wire,
the first electrode wire being configured to adhere, in a conductive manner, to the first electrode pad and the second electrode pad,
the second electrode wire being configured to adhere directly or indirectly, in a conductive manner, to the second electrode pad region in the second electrode stretched region.

* * * * *

UNITED STATES PATENT AND TRADEMARK OFFICE
CERTIFICATE OF CORRECTION

PATENT NO. : 11,910,637 B2
APPLICATION NO. : 17/435776
DATED : February 20, 2024
INVENTOR(S) : Takayuki Miyoshi and Katsuya Ouchi It is certified that error appears in the above-identified patent and that said Letters Patent is hereby corrected as shown below:

In the Claims

In Claim 5, Line 57:
Delete "any one of";

In Claim 6, Line 5:
"The organic EL panel according to claim1, further"
Should read:
--The organic EL panel according to claim 1, further--.

Signed and Sealed this
Ninth Day of April, 2024

Katherine Kelly Vidal
*Director of the United States Patent and Trademark Office*